(12) United States Patent
Rotte et al.

(10) Patent No.: US 10,531,034 B2
(45) Date of Patent: Jan. 7, 2020

(54) SHARED PHOTODIODE RESET IN A 5 TRANSISTOR-FOUR SHARED PIXEL

(71) Applicant: GRASS VALLEY CANADA, Montreal, Quebec (CA)

(72) Inventors: Jeroen Rotte, Breda (NL); Petrus Gijsbertus Centen, Goirle (NL); Arnaud Defernez, Breda (NL)

(73) Assignee: GRASS VALLEY CANADA, Montreal (CA)

( * ) Notice: Subject to any disclaimer, the term of this patent is extended or adjusted under 35 U.S.C. 154(b) by 9 days.

(21) Appl. No.: 15/991,116

(22) Filed: May 29, 2018

(65) Prior Publication Data

US 2018/0278875 A1 Sep. 27, 2018

Related U.S. Application Data

(63) Continuation-in-part of application No. 15/697,349, filed on Sep. 6, 2017, now Pat. No. 10,270,987, and (Continued)

(51) Int. Cl.
*H04N 5/374* (2011.01)
*H04N 5/357* (2011.01)
(Continued)

(52) U.S. Cl.
CPC .......... *H04N 5/378* (2013.01); *H01L 27/146* (2013.01); *H01L 27/14603* (2013.01);
(Continued)

(58) Field of Classification Search
None
See application file for complete search history.

(56) References Cited

U.S. PATENT DOCUMENTS 7,238,544 B2 * 7/2007 Hong ............... H01L 27/14603
257/E27.131
8,471,315 B1 6/2013 Hynecek et al.
(Continued)

FOREIGN PATENT DOCUMENTS

EP 1139658 A2 5/2005
JP 2010268529 A 11/2010

OTHER PUBLICATIONS

International Search Report and Written Opinion dated Aug. 16, 2018, regarding PCT/CA2018/050636.
(Continued)

*Primary Examiner* — Mark T Monk
(74) *Attorney, Agent, or Firm* — Arent Fox LLP

(57) ABSTRACT

An image sensor that provides global shutter scanning with exposure time control during image capture. The image sensor includes a pixel array with shared pixel units that each include four photodiodes with a floating diffusion node shared therebetween and respective global shutter gates disposed between each photodiode and a supply voltage of the pixel array. Moreover, an image capture timing controller controls an exposure time of each photodiode by adjusting a width of a global shutter reset pulse applied to the plurality of global shutter gates after each readout cycle during image capture to change the respective exposure time of each shared pixel unit.

28 Claims, 33 Drawing Sheets

Related U.S. Application Data a continuation-in-part of application No. 15/362,023, filed on Sep. 8, 2016, now Pat. No. 10,270,997.

(60) Provisional application No. 62/385,204, filed on Sep. 8, 2016, provisional application No. 62/385,027, filed on Sep. 8, 2016, provisional application No. 62/512,399, filed on May 30, 2017.

(51) Int. Cl.
| | |
|---|---|
| *H04N 5/353* | (2011.01) |
| *H01L 27/146* | (2006.01) |
| *H04N 5/378* | (2011.01) |
| *H04N 5/347* | (2011.01) |
| *H04N 5/343* | (2011.01) |
| *H04N 5/3745* | (2011.01) |

(52) U.S. Cl.
CPC ....... *H01L 27/14641* (2013.01); *H04N 5/343* (2013.01); *H04N 5/347* (2013.01); *H04N 5/3575* (2013.01); *H04N 5/3745* (2013.01); *H04N 5/37457* (2013.01); *H04N 5/3532* (2013.01)

(56) References Cited

U.S. PATENT DOCUMENTS

| | | |
|---|---|---|
| 2005/0057674 A1 | 3/2005 | Krymski et al. |
| 2009/0108176 A1 | 4/2009 | Blanquart |
| 2010/0309340 A1 | 12/2010 | Border et al. |
| 2013/0057744 A1 | 3/2013 | Minagawa et al. |
| 2014/0263964 A1* | 9/2014 | Yang ............... H04N 5/347 250/208.1 |
| 2014/0333809 A1 | 11/2014 | Bock |
| 2016/0165159 A1 | 6/2016 | Hseih et al. |
| 2016/0353034 A1 | 12/2016 | Mauritzson et al. |

OTHER PUBLICATIONS

International Search Report & Written Opinion issued in PCT/EP2017/072630 dated Nov. 28, 2017.

Non-Final Office Action dated Apr. 11, 2018, issued in U.S. Appl. No. 15/362,023.

Non-Final Office Action dated May 30, 2018, issued in U.S. Appl. No. 15/697,349.

\* cited by examiner

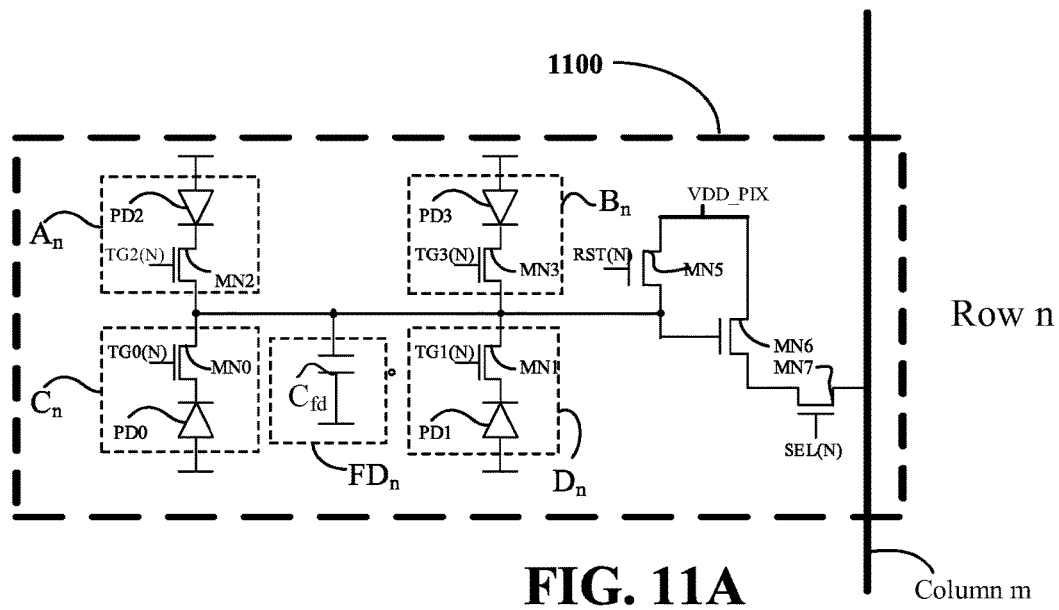
FIG. 11A
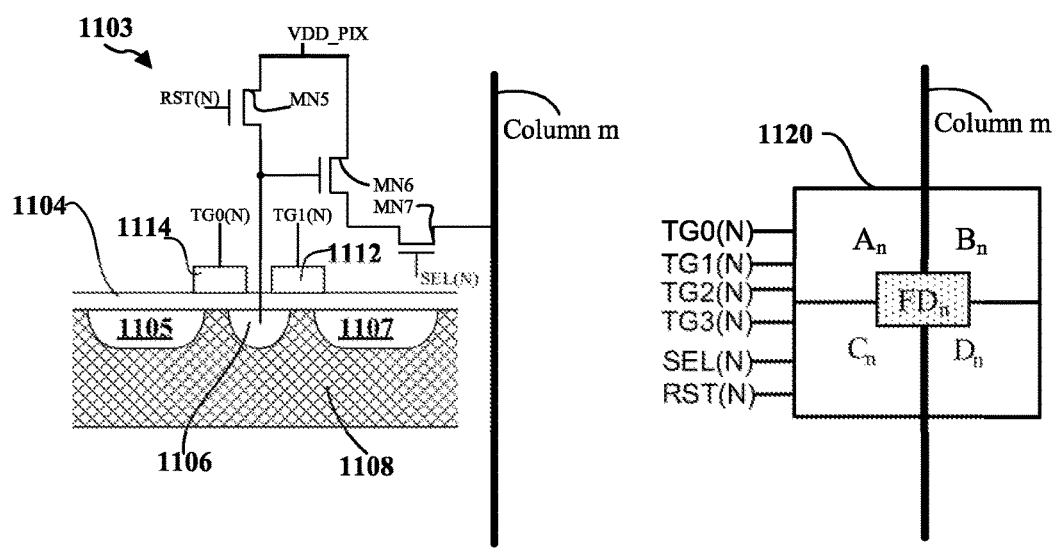 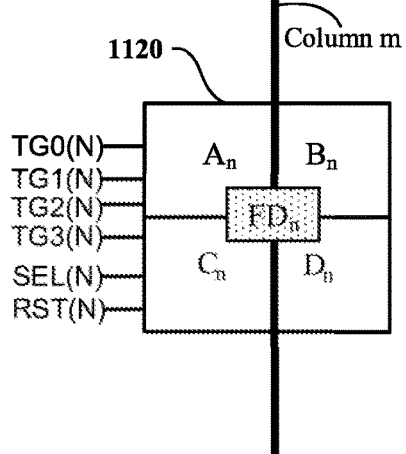
FIG. 11B     FIG. 11C

SHARED PHOTODIODE RESET IN A 5 TRANSISTOR-FOUR SHARED PIXEL

CROSS-REFERENCE TO RELATED APPLICATIONS

This application is a continuation-in-part of U.S. application Ser. No. 15/697,349, filed Sep. 6, 2017, which claims priority to U.S. Provisional Application Ser. No. 62/385,204, filed on Sep. 8, 2016. U.S. application Ser. No. 15/697,349 is a continuation-in-part of U.S. application Ser. No. 15/362,023, filed Nov. 28, 2016, which claims priority to U.S. Provisional Application Ser. No. 62/385,027, filed on Sep. 8, 2016. This application also claims priority to U.S. Provisional Application Ser. No. 62/512,399, filed on May 30, 2017. The entire contents of each of these applications are hereby incorporated by reference herein in their entirety.

TECHNICAL FIELD

The disclosure herein generally relates to digital cameras, and more particularly to cameras using complementary metal oxide semiconductor (CMOS) image sensors.

BACKGROUND

Complementary metal oxide semiconductor ("CMOS") image sensors are widely used in digital cameras to produce digital images by converting optical signals into electrical signals. In operation, CMOS image sensors may convert an optical signal into an electrical signal using a multitude of pixels that each include a photodiode and a read-out circuit. The photodiode generates electric charges using absorbed light, converts the generated electric charges into an analog current, and delivers the analog current to the read-out circuit. The read-out circuit may convert the analog signal into a digital signal and outputs the digital signal.

Certain CMOS image sensor pixel circuits are formed using four transistors and are known and referred to as 4T image sensor pixels or "4T pixels." FIG. 1 illustrates an exemplary design of a 4T pixel 110 connected to a bit-line 120. As shown, the 4T CMOS image sensor pixel 110 includes a photodiode ("PD") that provides the photon to electron conversion, while a floating diffusion ("FD") point provides the electron to voltage conversion. The voltage per electron conversion of the FD is known as conversion gain ("CG") and is an important parameter for CMOS image sensors. Conversion gain boosts the pixel signal relative to the analog noise, thereby reducing the noise floor, and thereby enabling performance at lower light levels.

For such CMOS image sensors, during the analog-to-digital conversion process, a comparator receives an analog voltage and compares the analog voltage with a ramp voltage. In one implementation of a CMOS image sensor, the comparator compares the analog voltage with the ramp voltage, and uses a counter to count until the ramp voltage is greater than an analog voltage. Once the counter stops counting, a count value is digital data corresponding to an analog voltage, that is, the count value is the digital data into which the analog voltage has been converted.

Referring to FIG. 1, the pixel is reset when the reset transistor ("RST") and transfer gate ("TG") are turned on simultaneously, setting both the floating diffusion FD and the photodiode PD to the VDD voltage level. Next, the transfer gate TG is turned off (disconnecting the photodiode PD and floating diffusion FD) and the photodiode PD is left to integrate light.

After integration, the signal measurement occurs. First, the reset transistor RST is turned on and off to reset the floating diffusion FD. Immediately after this, the reset level is sampled from the floating diffusion FD and stored on the column circuit, i.e., bit-line 120. Next, the transfer gate TG is turned on and off which allows charge on the photodiode PD to transfer to the floating diffusion (FD). Once the charge transfer is complete, this charge (the photodiode signal level plus the floating diffusion reset level) is measured and stored on bit-line 120 as well.

These two stored voltages are then differenced ($D_{sig}-D_{rst}$) to determine the photodiode signal level. The 4T pixel design 110 significantly improves the performance of other CMOS image sensors, reducing both read noise and image lag. In addition, the design reduces pixel source follower offsets and the like.

SUMMARY

In one exemplary aspect, an image sensing system is disclosed for providing global shutter scanning with exposure time control during image capture. In this aspect, the image sensing system includes a complementary metal oxide semiconductor (CMOS) image sensor including a pixel array having a plurality of shared pixel units that each comprise four photodiodes with a floating diffusion node shared therebetween and a plurality of global shutter gates respectively disposed between each photodiode and a supply voltage of the CMOS image sensor, a plurality of vertical and horizontal charge circuitry coupled to the CMOS image sensor and configured to activate the plurality of shared pixel units during image capture; and an image capture timing controller configured to control the plurality of vertical and horizontal charge circuitry to bin charge concurrently between the four photodiodes and the shared floating diffusion node of each shared pixel unit to collectively sample output values of each shared pixel unit that combines output values of the four photodiodes during a respective readout cycle of the image capture. Moreover, the exemplary image sensing system includes a column readout circuit having a plurality of storage capacitors selectively coupled to the pixel array that are each configured to store sampled output values of the four photodiodes of each shared pixel unit during each respective readout cycle by the CMOS image sensor; and an image generating unit configured to generate image data based on the stored sampled output values in the plurality of storage capacitors with the generated image data being configured to be displayed on a display device.

According to an exemplary aspect, each shared pixel unit comprises four global shutter gates with a first pair of global shutter gates connected to a pair of adjacent global shutter gates in a first adjacent shared pixel unit and a second pair of global shutter gates connected to a pair of adjacent global shutter gates in a second adjacent shared pixel unit. Moreover, in another exemplary aspect, the image capture timing controller is configured to apply a global shutter reset after each readout cycle of each respective shared pixel unit by applying a global shutter pulse to the respective global shutter gates of the respective shared unit pixel without affecting the sampled output values of the floating diffusion node during the respective readout cycle, and the image capturing timing controller is configured to control an exposure time of each photodiode of each respective shared pixel by adjusting a width of the global shutter pulse to change the respective exposure time for the image capture.

In another exemplary aspect of the image sensing system, the first pair of global shutter gates of each shared pixel unit are connected to a pair of adjacent global shutter gates in the first adjacent shared pixel unit that is directly above the respective shared pixel unit of the pixel array, and the second pair of global shutter gates of each shared pixel unit are connected to a pair of adjacent global shutter gates in the second adjacent shared pixel unit that is directly below the respective shared pixel unit of the pixel array.

In another exemplary aspect of the image sensing system, each of the plurality of global shutter gates is a MOSFET.

In another exemplary aspect of the image sensing system, the pixel array comprises a first row of shared pixel units comprising at least one first shared pixel unit and a second row of shared pixel units comprising at least one second shared pixel unit. Moreover, in one aspect, the column readout circuit is further configured to read the stored sampled output values from the shared floating diffusion node of the at least one first shared pixel unit and the shared floating diffusion node of the at least one second shared pixel unit.

In yet another exemplary aspect, an image sensing system is disclosed for providing global shutter scanning with exposure time control. In this aspect, the image sensing system includes an image sensor including a pixel array having a plurality of shared pixel units that each comprise a plurality of photodiodes with a floating diffusion node shared therebetween and a plurality of global shutter gates respectively disposed between each photodiode and a supply voltage of the image sensor; an image capture timing controller configured to control the image sensor to bin charge concurrently between the plurality of photodiodes and the shared floating diffusion node of each shared pixel unit to collectively sample output values of each shared pixel unit that combines output values of the plurality of photodiodes during a respective readout cycle of the image capture; and an image generator configured to generate image data based on the sampled output values, with the generated image data being configured to be displayed on a display device.

Moreover, in an exemplary aspect, for each shared pixel unit, a first pair of global shutter gates are connected to a pair of global shutter gates in a first adjacent shared pixel unit and a second pair of global shutter gates connected to a pair of global shutter gates in a second adjacent shared pixel unit. Yet further, the image capture timing controller is configured to apply a global shutter reset pulse after each readout cycle of each respective shared pixel unit without affecting the sampled output values of the floating diffusion node during the respective readout cycle, and to control an exposure time of each photodiode of each respective shared pixel by adjusting a width of the global shutter reset pulse to change the respective exposure time for the image capture.

In yet another exemplary aspect, an image sensor is disclosed for providing global shutter scanning with exposure time control during image capture. In this aspect, the image sensor includes a pixel array having a plurality of shared pixel units that each comprise a plurality of photodiodes with a floating diffusion node shared therebetween and a plurality of global shutter gates respectively disposed between each photodiode and a supply voltage of the pixel array; and an image capture timing controller configured to control an exposure time of each photodiode by adjusting a width of a global shutter reset pulse applied to the plurality of global shutter gates after each readout cycle during image capture to change the respective exposure time of each shared pixel unit.

Other aspects of apparatuses described herein will become readily apparent to those skilled in the art based on the following detailed description, wherein various aspects of memory are shown and described by way of illustration. These aspects may be implemented in many different forms and its details may be modified in various ways without deviating from the scope of the present invention. Accordingly, the drawings and detailed description provided herein are to be regarded as illustrative in nature and not as restricting the scope of the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 11A illustrates a schematic diagram of a shared pixel unit according to an embodiment.

FIG. 11B illustrates a partial cross-sectional device diagram of a shared pixel unit according to the embodiment of FIG. 11A.

FIG. 11C illustrates a symbol diagram of the shared pixel unit according to the embodiment of FIG. 11A.

DETAILED DESCRIPTION

Figure 1:
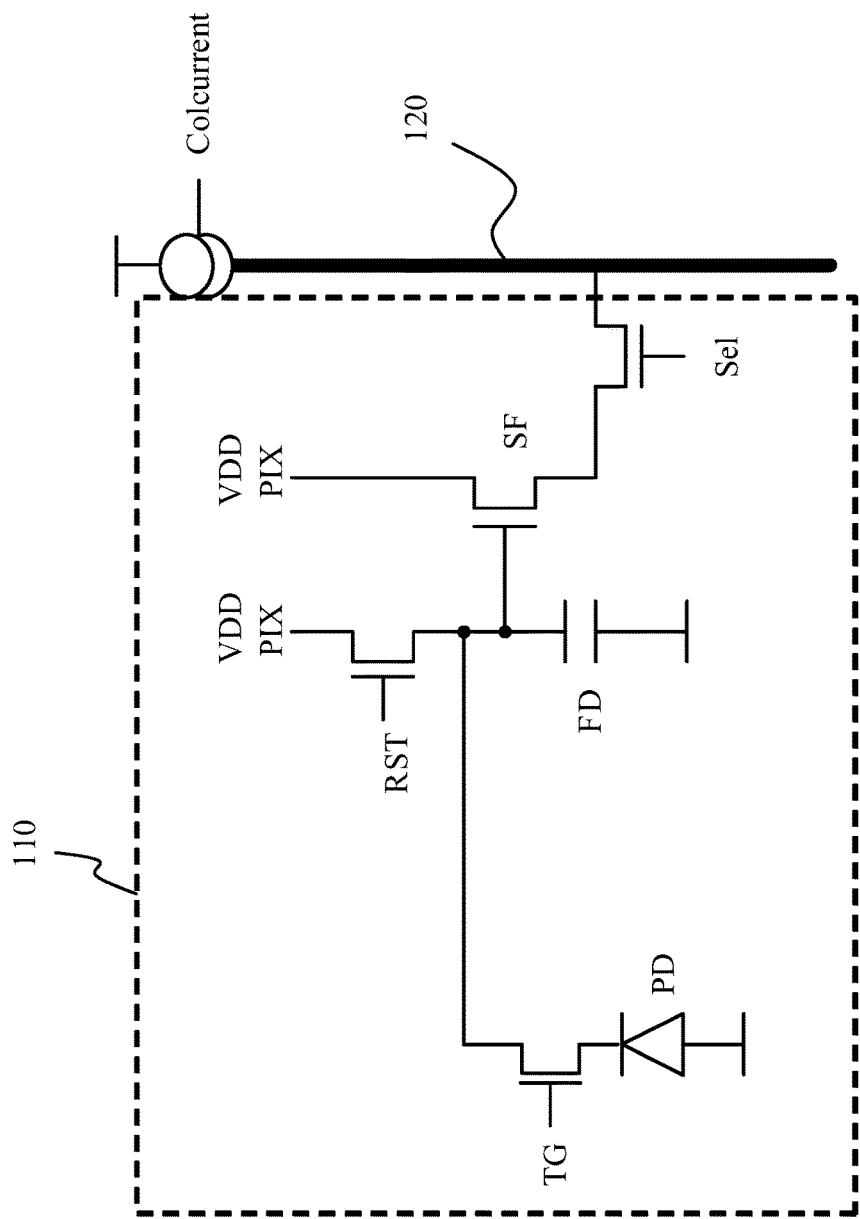
FIG. 1 illustrates a conventional design of a 4T pixel configuration of a CMOS image sensor connected to a column circuit.

Various aspects of the disclosed system and method are now described with reference to the drawings, wherein like reference numerals are used to refer to like elements throughout. In the following description, for purposes of explanation, numerous specific details are set forth in order to promote a thorough understanding of one or more aspects of the disclosure. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

In one configuration, the number of rows and columns of photodiodes in a pixel array of a CMOS image sensor may both be doubled. As a result, there may be four time of photodiodes in an image area compared with the number of photodiodes when the image area is filled with 4T pixels. In such a configuration, each pixel area that may originally be occupied by one 4T pixel may contain four photodiodes. Such a pixel that contains four photodiodes may be referred to as a 4T shared pixel, a shared pixel, and/or a shared pixel unit.

Figure 2:
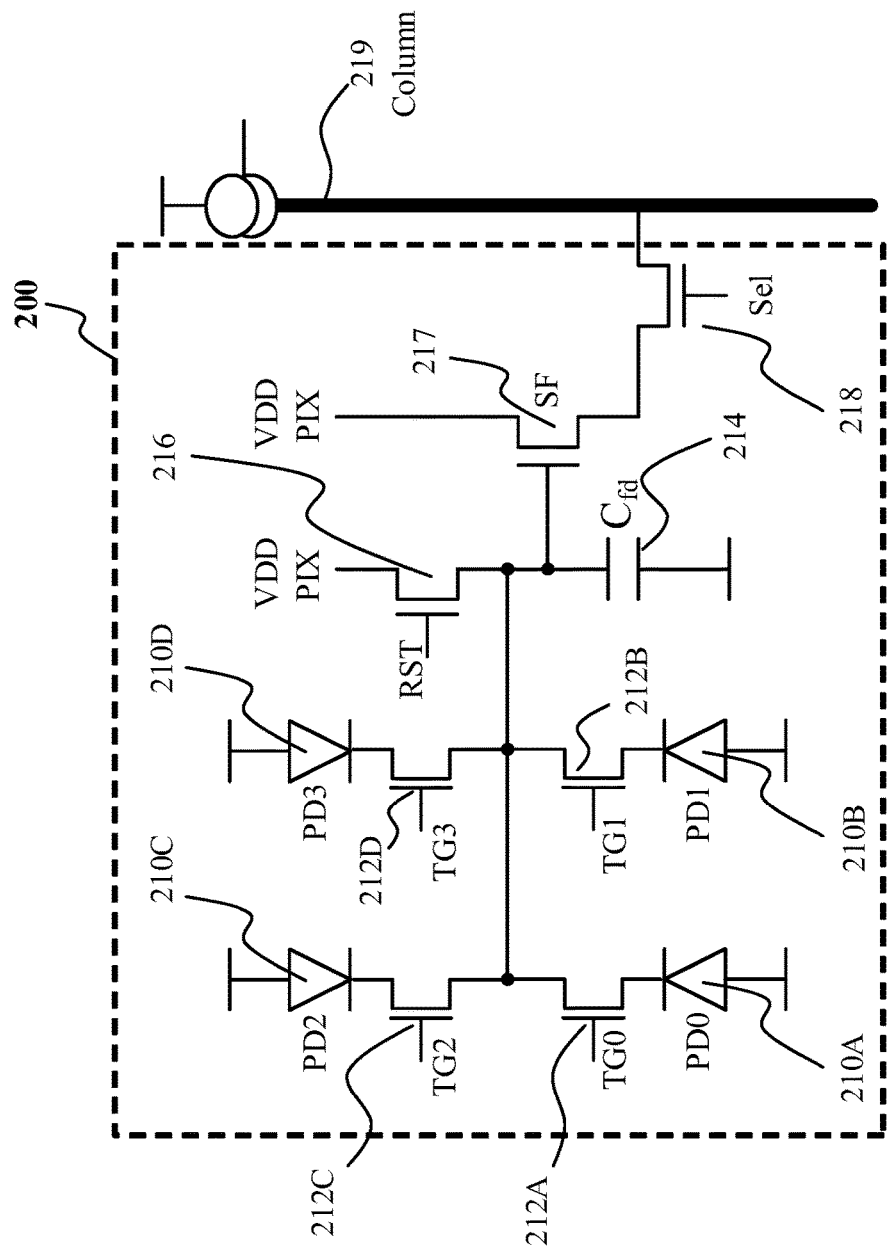
FIG. 2 illustrates a schematic diagram of an exemplary 4T shared pixel CMOS image sensor that can be implemented in connection with an exemplary embodiment.

FIG. 2 illustrates a schematic diagram of an exemplary 4T shared pixel CMOS image sensor that can be implemented in connection with an exemplary embodiment. The shared pixel 200 includes a similar configuration as the 4T pixel described above except that it includes four sub-pixels, e.g., photodiodes 210A, 210B, 210C and 210D (also shown as PD0-PD3) that are each driven by a respective transfer gate (shown as TG0-TG3). The transfer gates, which are CMOS transistors, are identified by reference numerals 212A, 212B, 212C and 212D. As shown, each of the transfer gates 212A-112D shares a common readout circuit and is connected to floating diffusion point, 214, i.e., capacitor $C_{fd}$. As further shown, both transistor 216 (reset transistor) and transistor 217 have drains connected to the voltage source of the pixel (e.g., VDD PIX). The source of reset transistor 216 is connected to the floating diffusion point 214 and the source of transistor 217 is connected to the drain of the select transistor 218. The source of select transistor 218 is connected to the column circuit 219.

As will be discussed in more detail below, each sub-pixel (i.e., each of photodiodes PD0-PD3) can be read out separately by activating its corresponding transfer gate. Thus, to read out photodiode 210A, the transfer gate 212A is turned on/activated. Similarly, photodiode 210B is read out by activating transfer gate 212B, and so forth. In some instances, multiple sub-pixels will be read out at the same time as a single read operation by activating the respective transfer gates simultaneously.

In order to take advantage of the higher resolution provided by the shared pixels, each photodiode of a shared pixel may need to be read out individually. To read out each photodiode of a shared pixel individually, four wires may be needed to addressed each photodiodes individually. Having four wires connected to a shared pixel may degrade the performance of the shared pixel, e.g., by blocking the optical paths of the shared pixel, and/or by detrimentally affecting the conversion gain, fill factor, sensitivity of the image sensor. Thus, it may be desirable to reduce the interconnection/wiring associated with a shared pixel while maintaining the capability to read out each photodiode of the shared pixel individually.

Figure 3:
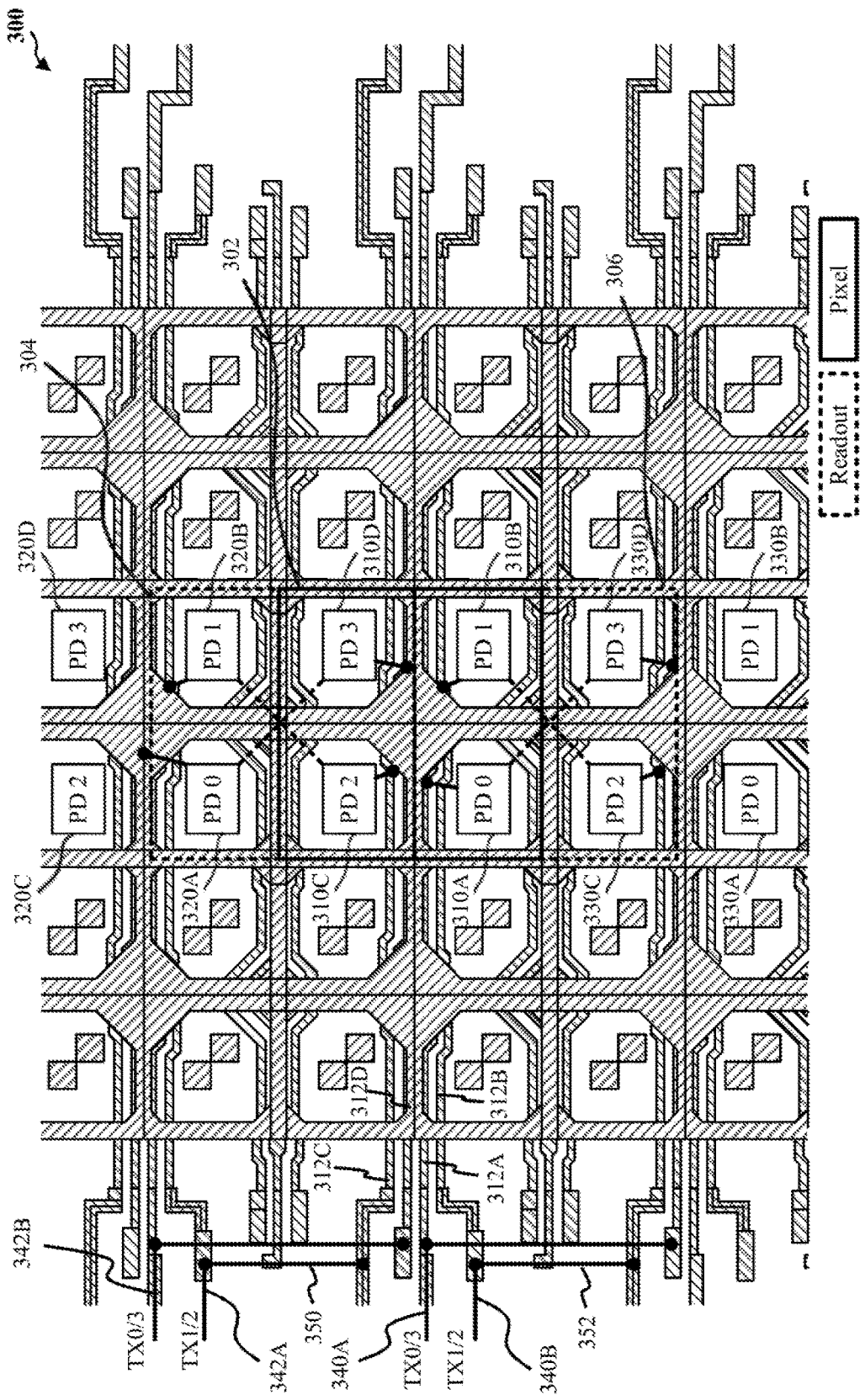
FIG. 3 illustrates a top-down view of a portion of a pixel array according to an exemplary embodiment.

FIG. 3 illustrates a top-down view of a portion of a pixel array 300 according to an exemplary embodiment. The pixel array 300 includes a multitude of shared pixels described above. For example, as shown in the middle of the exemplary pixel array 300, a shared pixel 302 is shown as a solid dark square and includes sub-pixels (i.e., photodiodes PD0-PD3) identified as photodiodes 310A-310D. As further shown, a shared pixel including photodiodes 320A, 320B, 320C and 320D is shown in the array row above the row of the shared pixel 302 and another shared pixel including photodiodes 330A, 330B, 330C and 330D is shown in the array row below the row of the shared pixel 302. In one configuration, each of the shared pixel 302, and the shared pixels above and below the shared pixel 302 may be the shared pixel 200 described above in FIG. 2.

According to the exemplary embodiment, the pixel array 300 shows a three by three array of 4T shared pixels. The pixel array 300 can be a portion of an array with 1125 rows, and each row can comprise two sub-pixels (i.e. photodiodes PD0 and PD2). Thus, each row may comprise vertical shift registers that are two by 1125 lines deep, i.e., 2250 lines. Additionally, because there are a total of four sub-pixels (i.e. photodiodes PD0-PD3), an array with 1125 rows can provide a total of 4500 sub-pixel signals or voltages, each of which are to be readout by the platform and/or camera system using the pixel array 300. A camera system or platform using digital double sampling (DDS) may be further required to readout both a dark signal and a bright signal per image; thus, a platform may be required to readout a total of two times 4500 sub-pixel signals (9000 sub-pixel signals) per image. According to the teachings herein, another readout method, differential DDS (dDDS) can be advantageously used to further reduce the number of required readouts from 9000 to 6750.

As further shown, each of the photodiodes of pixel 302 are connected to its respective transfer gate as described above. Thus, photodiode 310A is connected to transistor 312A, photodiode 310B is connected to transistor 312B, photodiode 310C is connected to transistor 312C, and photodiode 310D is connected to transistor 312D. Although pixel 302 is illustrated with a solid line square, the pixel array 300 provides a cross connection of pixels such that sub-pixels of adjacent pixels are read out concurrently to minimize bandwidth. Each readout is illustrated with dashed lines and boxes. Thus, the sub-pixels forming the grouping of sub-pixels 306 may be read out first followed by the grouping of sub-pixels 304, as will become readily apparent based on the following disclosure.

Thus, photodiode 310C (PD2) of the shared pixel 302 may be read out concurrently when photodiode 320B (PD1) of the shared pixel in the row above is read out. In one configuration, photodiode 310C (PD2) may be read out during a first clock cycle, and photodiode 320B (PD1) may be read out during a second clock cycle. The first clock cycle and the second cycle may be consecutive clock cycles. Similarly, photodiode 310D (PD3) of the shared pixel 302 may be read out concurrently when photodiode 320A (PD0) of the shared pixel in the row above is read out. In one configuration, photodiode 310D (PD3) may be read out during a first clock cycle, and photodiode 320A (PD0) may be read out during a second clock cycle. The first clock cycle and the second cycle may be consecutive clock cycles.

Moreover, when photodiode 310A (PD0) of pixel 302 is read out, photodiode 330D (PD3) of the shared pixel in the row below may also get read out. In one configuration, photodiode 310A (PD0) may be read out during a first clock cycle, and photodiode 330D (PD3) may be read out during a second clock cycle. The first clock cycle and the second cycle may be consecutive clock cycles. Similarly, when photodiode 310B (PD1) of pixel 302 is readout, photodiode 330C (PD2) of the shared pixel in the row below may also get read out. In one configuration, photodiode 310B (PD1) may be read out during a first clock cycle, and photodiode 330C (PD2) may be read out during a second clock cycle. The first clock cycle and the second cycle may be consecutive clock cycles.

As explained above with reference to FIG. 2, to read out a value of a particular photodiode, the respective transfer gate must be activated. In this instance, transfer gate signals are applied to sub-pixels in adjacent rows, to read out two values concurrently. For example, as shown a transfer gate signal $TG_{0/3}$ (i.e., signal 340A) is applied to transistor 312A, such that the sub-pixel 310A can be read out as shown above. As further shown, this transfer gate signal 340A is also applied to the transfer gate for photodiode 330D on the adjacent row below the row of the shared pixel 302. During the same readout period that the transfer gate signal 340A is activated, the control circuit also activates transfer gate signal 340B, which activates the transfer gates for photodiode 310B of the shared pixel 302 and photodiode 330C (i.e., PD2) of the shared pixel directly below the shared pixel 302. As shown, transfer gate signal 340A and transfer gate signal 340B are in the same row of the shift register.

Furthermore, during the next readout period, transfer gate signals 342A and 342B will be applied in a similar manner. Transfer gate signals 342A activates the transfer gates for photodiode 310C of the shared pixel 302 and photodiode 320B of the shared pixel directly above the shared pixel 302 in the pixel array 300. Similarly, transfer gate signals 342B activates the transfer gates for photodiode 310D of the shared pixel 302 and photodiode 320A of the shared pixel directly above the shared pixel 302 in the pixel array 300.

Figure 4:
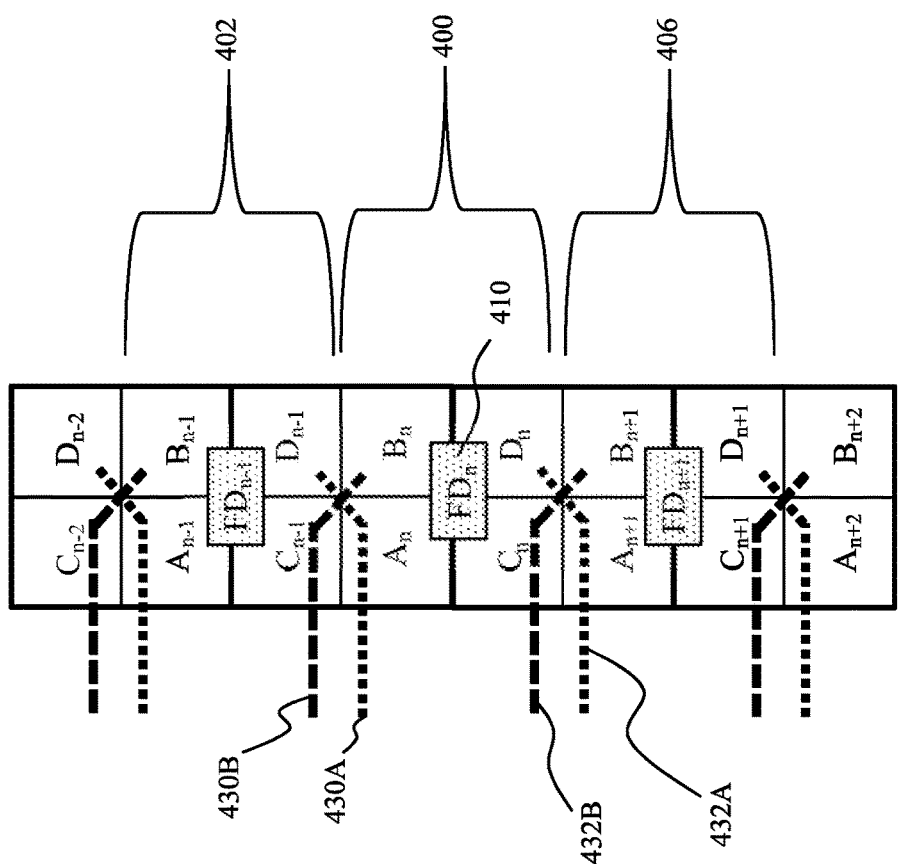
FIG. 4 illustrates a block diagram of a conceptual view of a portion of the pixel array shown in FIG. 3.

In one configuration, the interconnections (e.g., 350 and 352) that cross-couple transfer gates of two different shared pixels may be located at the edge of the image area, as illustrated in FIG. 4. In one configuration, the interconnections (e.g., 350 and 352) that cross-couple transfer gates of two different shared pixels may be located in the pixel grid (e.g., in the shared pixel 302 and the shared pixel above or below the shared pixel 302), thus reducing the amount of shift registers on the edge of the image area.

FIG. 4 illustrates a block diagram of a conceptual view of a portion of the pixel array shown in FIG. 3. In particular, the column shown in this figure includes a shared pixel 400 that includes sub-pixels $A_n$, $B_n$, $C_n$ and $D_n$. In one configuration, the shared pixel 400 may be the shared pixel 200 or 302 discussed above, and the sub-pixels $A_n$, $B_n$, $C_n$ and $D_n$ may correspond to sub-pixels 210A-210D or 310A-310D discussed above. Moreover, as described above, each 4T shared pixel includes a floating diffusion point, which is illustrated as $FD_n$ and denoted by 410. As further shown, a shared pixel 402 in the preceding row is formed by sub-pixels $A_{n-1}$, $B_{n-1}$, $C_{n-1}$ and $D_{n-1}$ (including floating diffusion point $FD_{n-1}$) and two sub-pixels $C_{n-2}$ and $D_{n-2}$ are formed above the shared pixel 402. Similarly, the row following the shared pixel 400 includes a shared pixel 406 formed by sub-pixels $A_{n+1}$, $B_{n+1}$, $C_{n+1}$ and $D_{n+1}$ (including floating diffusion point $FD_{n+1}$), and two sub-pixels $A_{n+2}$ and $B_{n+2}$ are formed below the shared pixel 406. For purposes of this disclosure, the row for each shared pixel can be considered as rows n−2, n−1, n, n+1 and n+2. For example, the shared pixel 400 is on row n, the shared pixel 402 is on row n−1, and the shared pixel 406 is on row n+1.

As described above, each transfer gate is activated for two adjacent sub-pixels in the vertical direction (relative to the array) that are in different adjacent pixel rows (e.g., in rows n−1 and n, or in rows n and n+1). Thus, the transfer gates for sub-pixels $C_{n-1}$ and $B_n$ may first be activated by transfer gate signal 430B. Since sub-pixels $C_{n-1}$ and $B_n$ are in different rows, i.e., different shared pixels, the values of the sub-pixels $C_{n-1}$ and $B_n$ may be read out during the same readout period. Next, a transfer gate signal 430A may be applied to activate sub-pixels $A_n$ and $D_{n-1}$. After the activation by the pair of transfer gate signals 430A and 430B, the CMOS image sensor has performed a readout of sub-pixels $A_n$, $B_n$, $C_{n-1}$, and $D_{n-1}$. It should be appreciated that this readout may correspond to the dashed box 306 shown in FIG. 3 in which sub-pixel 310A (e.g., $A_n$), sub-pixel 310B (e.g., $B_n$), sub-pixel 330C (e.g., $C_{n-1}$), and sub-pixel 330D (e.g., $D_{n-1}$), are all read out during one readout period.

Referring back to FIG. 4, during the next cycle of readout, transfer gate signals 432B and 432A may be applied to activate the corresponding sub-pixels. In a similar manner as described above, the transfer gates for sub-pixels $C_n$ and $B_{n+1}$ may first be activated by transfer gate signal 432B. Next, transfer gate signal 432A may be applied to activate sub-pixels $A_{n+1}$ and $D_n$. Accordingly, after the activation by the pair of transfer gate signals 432A and 432B, the CMOS image sensor has performed a readout of sub-pixels $C_n$, $D_n$, $A_{n+1}$ and $B_{n+1}$.

Figure 5:
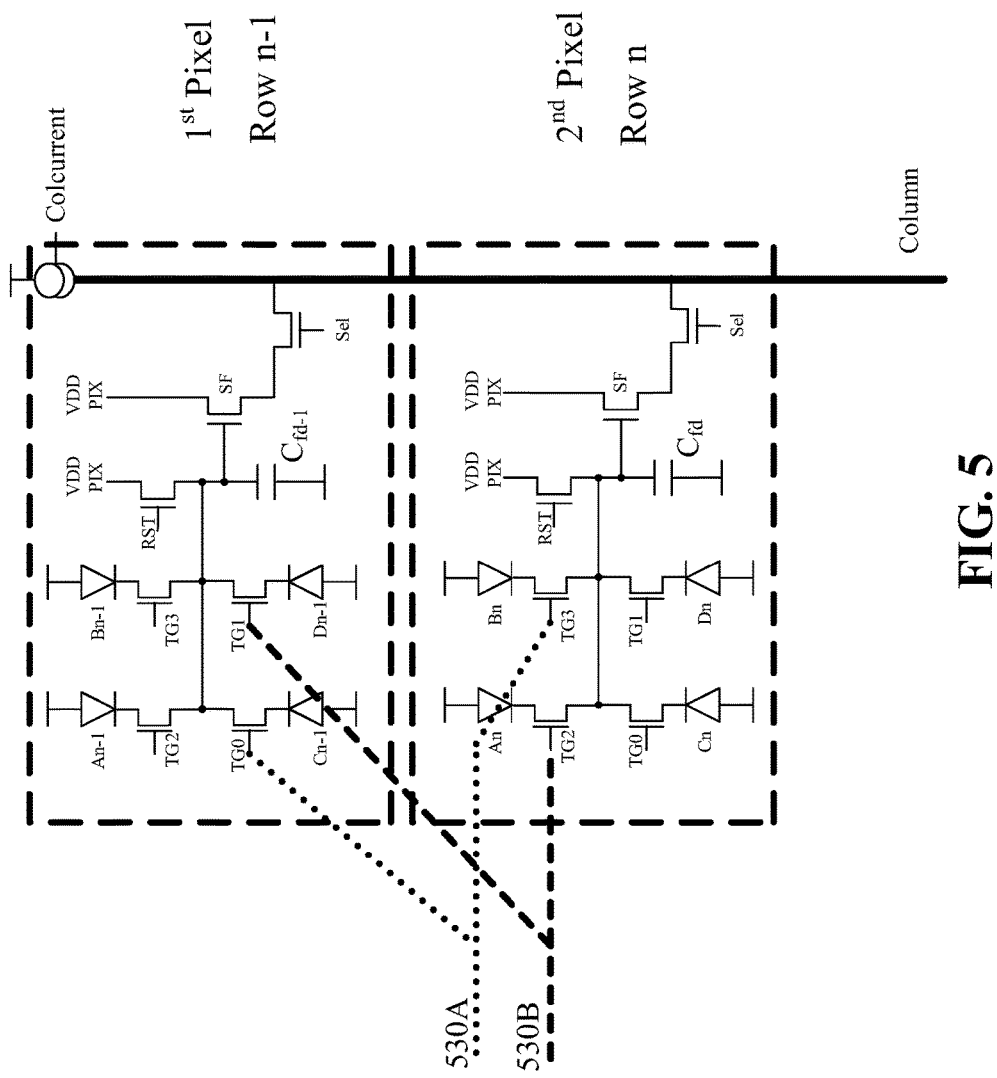
FIGS. 5 and 6 illustrate schematic diagrams of a plurality of 4T shared pixels in a pixel array of an image sensor according to an exemplary embodiment.
Figure 6:
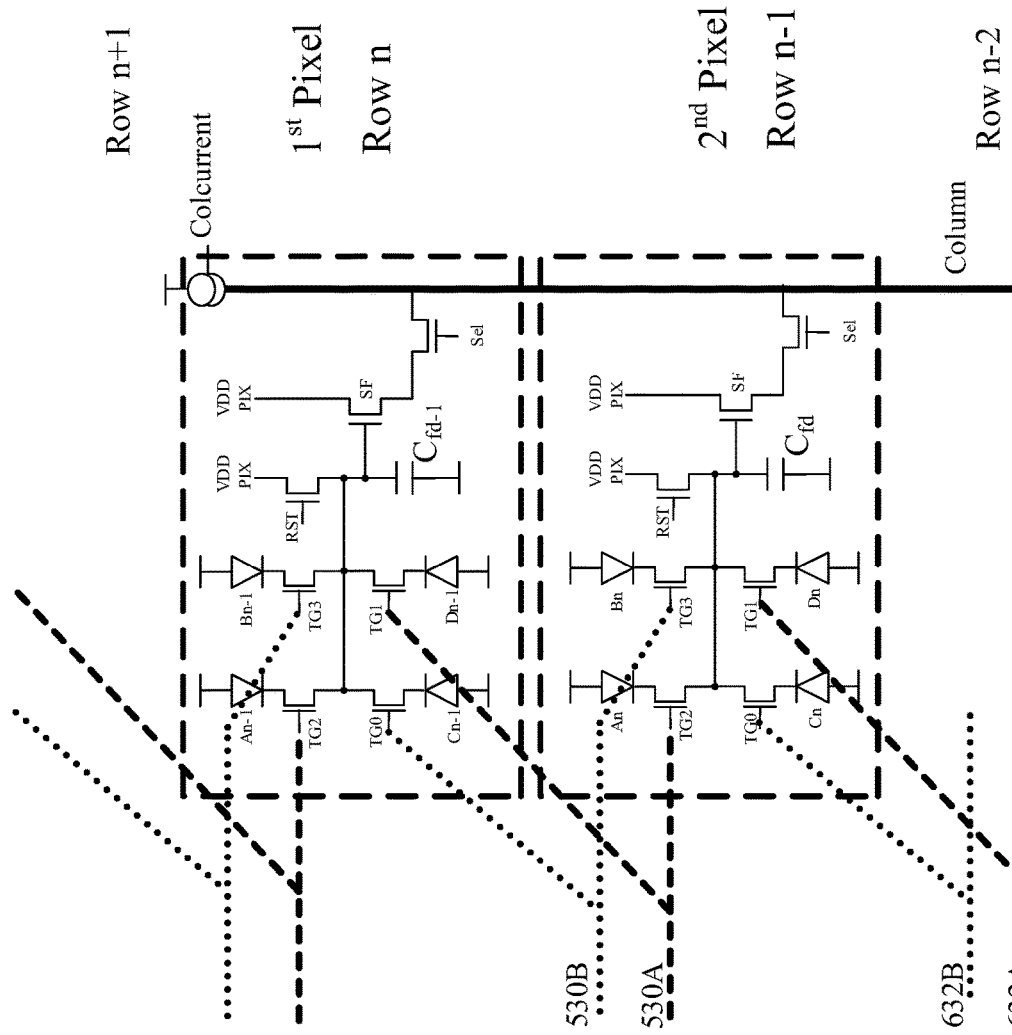

FIGS. 5 and 6 illustrate schematic diagrams of a plurality of 4T shared pixels in a pixel array of an image sensor according to an exemplary embodiment. As shown in FIG. 5, the pixel array includes a pair of adjacent rows, i.e., 1st pixel row n−1 and 2nd pixel row n, in the vertical direction of the pixel array. It should be appreciated that each separate shared pixel in row n and n−1 includes the same 4T shared transistor circuit configuration discussed above with respect to FIG. 2 and will not be repeated herein. As shown, one transfer gate signal 530A may be applied to the transfer gate (TG0) of sub-pixel $C_{n-1}$ and to the transfer gate (TG3) of sub-pixel $B_n$. Similarly, another transfer gate signal 530B may be applied to the transfer gate (TG2) of sub-pixel $A_n$ and to the transfer gate (TG1) of sub-pixel $D_{n-1}$. In one configuration, the transfer gate signals 530A and 530B may be the transfer gate signals 340A and 340B, 342A and 342B, 430A and 430B, or 432A and 432B described above.

FIG. 6 illustrates the same pixel array circuit diagram as in FIG. 5 and also shows application of additional transfer gate signals 632A and 632B, which are the same transfer gate signals described above. In both FIGS. 5 and 6, the output of each sub-pixel is connected to the column circuit to provide readouts.

Figure 7:
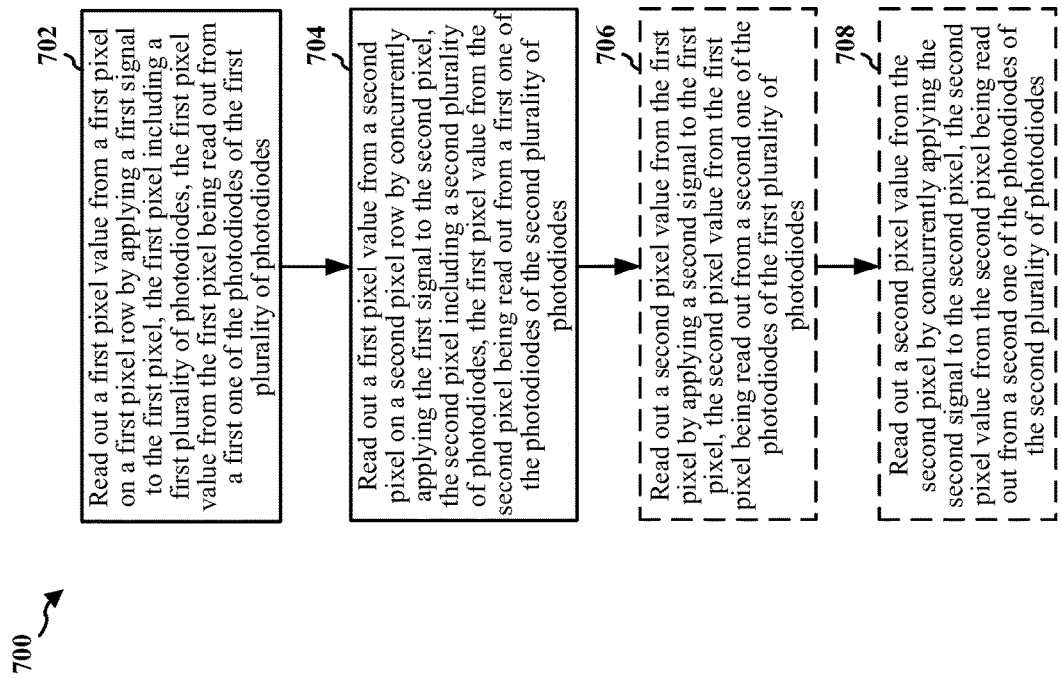
FIG. 7 is a flowchart of a method of performing digital sampling of pixel values of a CMOS image sensor.

FIG. 7 is a flowchart 700 of a method of performing digital sampling of pixel values of a CMOS image sensor. The method may be performed by an apparatus that includes a CMOS image sensor. The CMOS image sensor may include a pixel array, which may include a multitude of shared pixels as described above. At 702, the apparatus may read out a first pixel value from a first pixel (e.g., the shared pixel 400) on a first pixel row by applying a first signal (e.g., the transfer gate signal 430A) to the first pixel. The first pixel may include a first plurality of photodiodes. The first pixel value from the first pixel may be read out from a first one of the photodiodes of the first plurality of photodiodes (e.g., $A_n$).

At 704, The apparatus may read out a first pixel value from a second pixel (e.g., the shared pixel 402) on a second pixel row by concurrently applying the first signal (e.g., the transfer gate signal 430A) to the second pixel. The second pixel may include a second plurality of photodiodes. The first pixel value from the second pixel may be read out from a first one of the photodiodes of the second plurality of photodiodes (e.g., $D_{n-1}$).

In one configuration, the first pixel row may be adjacent to the second pixel row, and the first pixel may be adjacent to the second pixel. In one configuration, the first one of the photodiodes of the first plurality of photodiodes (e.g., $A_n$) and the first one of the photodiodes of the second plurality of photodiodes (e.g., $D_{n-1}$) may be on different columns. In one configuration, the first pixel value from the first pixel may be read out during a first clock cycle, and the first pixel value from the second pixel may be read out during a second clock cycle. The first clock cycle and the second clock cycles may be consecutive clock cycles.

At 706, the apparatus may optionally read out a second pixel value from the first pixel (e.g., the shared pixel 400) by applying a second signal (e.g., the transfer gate signal 430B) to the first pixel. The second pixel value from the first pixel may be read out from a second one of the photodiodes of the first plurality of photodiodes (e.g., $B_n$).

At 708, the apparatus may optionally read out a second pixel value from the second pixel (e.g., the shared pixel 402) by concurrently applying the second signal (e.g., the transfer gate signal 430B) to the second pixel. The second pixel value from the second pixel may be read out from a second one of the photodiodes of the second plurality of photodiodes (e.g., $C_{n-1}$).

In one configuration, the second one of the photodiodes of the first plurality of photodiodes (e.g., $B_n$) and the second one of the photodiodes of the second plurality of photodiodes (e.g., $C_{n-1}$) may be on different columns. In one configuration, the second pixel value from the first pixel may be read out during a first clock cycle, and the second pixel value from the second pixel may be read out during a second clock cycle. The first clock cycle and the second clock cycles may be consecutive clock cycles.

In one configuration, the apparatus may include a first row of pixels including a first pixel (e.g., the shared pixel 402). The first pixel may include a first plurality of photodiodes and a first plurality of transfer gates. Each of the first plurality of photodiodes may be associated with a corresponding one of the first plurality of transfer gates. The apparatus may include a second row of pixels including a second pixel (e.g., the shared pixel 400). The second pixel may include a second plurality of photodiodes and a second plurality of transfer gates. Each of the second plurality of photodiodes may be associated with a corresponding one of the second plurality of transfer gates. A first one of the transfer gates of the first plurality of transfer gates (e.g., the transfer gate associated with $D_{n-1}$) may be coupled to a first one of the transfer gates of the second plurality of transfer gates (e.g., the transfer gate associated with $A_n$).

In one configuration, the connection for coupling the first one of the transfer gates of the first plurality of transfer gates (e.g., the transfer gate associated with $D_{n-1}$) and the first one of the transfer gates of the second plurality of transfer gates (e.g., the transfer gate associated with $A_n$) may be at the edge of an image area. The image area may include the first row of pixels and the second row of pixels. In one configuration, the connection for coupling the first one of the transfer gates of the first plurality of transfer gates (e.g., the transfer gate associated with $D_{n-1}$) and the first one of the transfer gates of the second plurality of transfer gates (e.g., the transfer gate associated with $A_n$) may be at the first pixel (e.g., the shared pixel 402) and the second pixel (e.g., the shared pixel 400).

In one configuration, a first one of the photodiodes of the first plurality of photodiodes (e.g., $D_{n-1}$) may be associated with the first one of the transfer gates of the first plurality of transfer gates, and a first one of the photodiodes of the second plurality of photodiodes is associated with the first one of the transfer gates of the second plurality of transfer gates (e.g., $A_n$). In one configuration, the first one of the photodiodes of the first plurality of photodiodes (e.g., $D_{n-1}$) and the first one of the photodiodes of the second plurality of photodiodes (e.g., $A_n$) may be on different columns. In one configuration, the first row of pixels may be adjacent to the second row of pixels. The first pixel may be adjacent to the second pixel.

In one configuration, a second one of the transfer gates of the first plurality of transfer gates (e.g., the transfer gate associated with $C_{n-1}$) may be coupled to a second one of the transfer gates of the second plurality of transfer gates (e.g., the transfer gate associated with $B_n$). In one configuration, the connection for coupling the second one of the transfer gates of the first plurality of transfer gates (e.g., the transfer gate associated with $C_{n-1}$) and the second one of the transfer gates of the second plurality of transfer gates (e.g., the transfer gate associated with $B_n$) may be at the edge of an image area. The image area may include the first row of pixels and the second row of pixels. In one configuration, the connection for coupling the second one of the transfer gates of the first plurality of transfer gates (e.g., the transfer gate associated with $C_{n-1}$) and the second one of the transfer gates of the second plurality of transfer gates (e.g., the transfer gate associated with $B_n$) may be at the first pixel (e.g., the shared pixel 402) and the second pixel (e.g., the shared pixel 400).

In one configuration, the apparatus may further include a third row of pixels comprising a third pixel (e.g., the shared pixel 406). The third pixel may include a third plurality of photodiodes and a third plurality of transfer gates. Each of the third plurality of photodiodes may be associated with a corresponding one of the transfer gates of the third plurality of transfer gates.

In one configuration, the second row of pixels may be adjacent to the third row of pixels, and the second row of pixels may be located between the first row of pixels and the third row of pixels. In one configuration, the second pixel (e.g., the shared pixel 400) may be adjacent to the third pixel (e.g., the shared pixel 406). In one configuration, the second pixel (e.g., the shared pixel 400) may be located between the first pixel (e.g., the shared pixel 402) and the third pixel (e.g., the shared pixel 406).

In one configuration, a third one of the transfer gates of the second plurality of transfer gates (e.g., the transfer gate associated with $C_n$) may be coupled to a first one of the transfer gates of the third plurality of transfer gates (e.g., the transfer gate associated with $B_{n+1}$). In one configuration, a fourth one of the transfer gates of the second plurality of transfer gates (e.g., the transfer gate associated with $D_n$) may be coupled to a second one of the transfer gates of the third plurality of transfer gates (e.g., the transfer gate associated with $A_{n+1}$). In one configuration, the connection for cross coupling the transfer gates may be at the edge of an image area. The image area may include the second row of pixels and the third row of pixels. In one configuration, the connection for cross coupling the transfer gates may be at the second pixel (e.g., the shared pixel 400) and the third pixel (e.g., the shared pixel 406).

Figure 8:
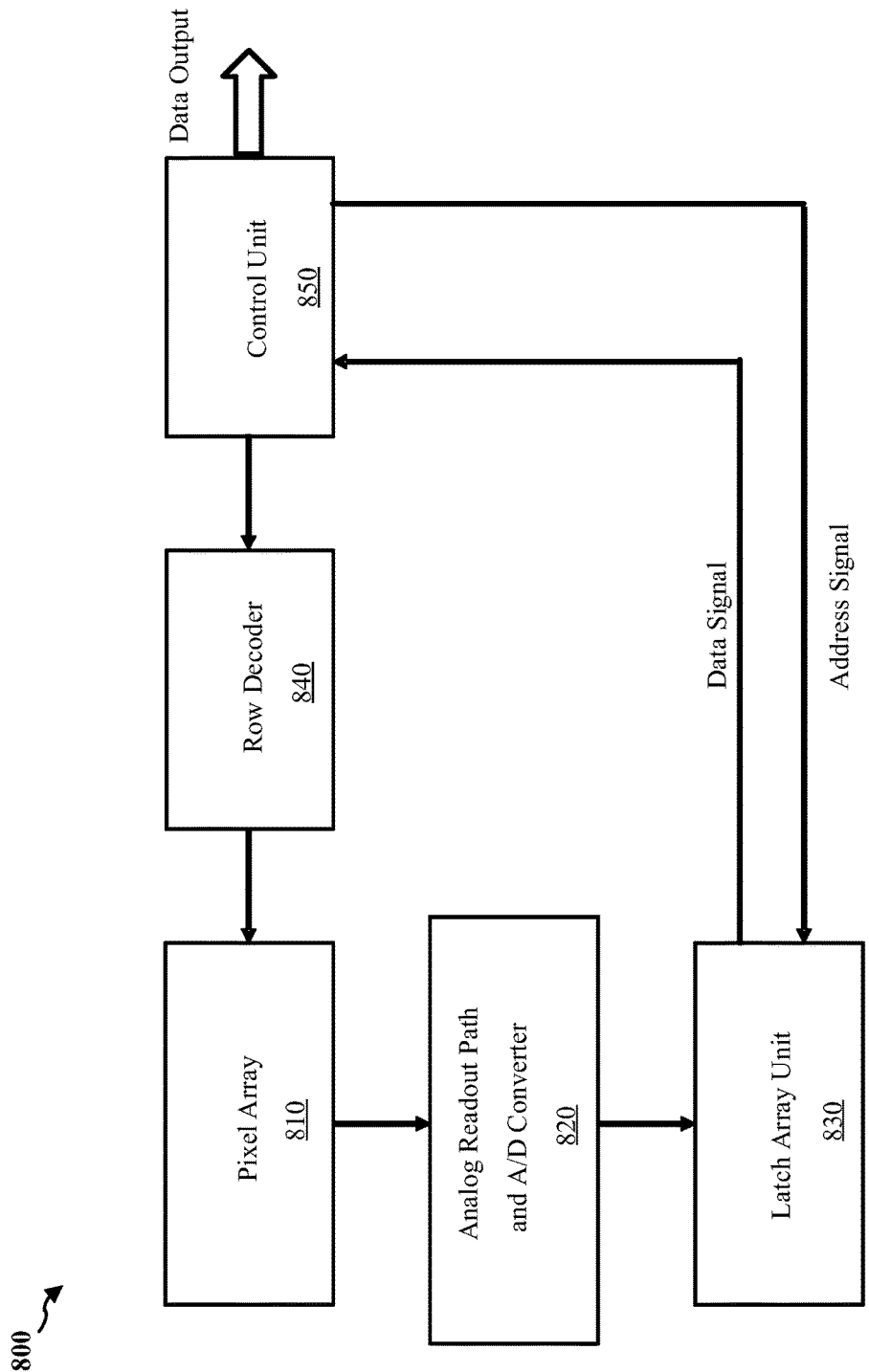
FIG. 8 illustrates a block diagram of a CMOS image sensor according to an exemplary embodiment.

FIG. 8 illustrates a block diagram of a CMOS image sensor according to an exemplary embodiment. As shown, the CMOS image sensor 800 includes a pixel array 810, which can be, for example, pixel array 300 described above that includes a multitude of 4T shared pixel configurations. Furthermore, the output of the pixel array 810 may be fed to an analog readout path and A/D converter 820, which is provided for processing the analog output voltages from the pixel array 810 to convert analog pixel signals into digital signals. It should be understood that the analog readout path and A/D converter 820 is known to those skilled in the art.

As further shown, a latch array unit (or line buffer) 830 is provided for storing the digital signals outputted from the analog readout path and A/D converter 820. It should be appreciated that the line buffer 830 can include multiple lines depending on the readout order of the pixels of pixel array 810. Moreover, a control unit 850 is provided for providing control signals used in controlling the aforementioned units and outputting data to the outside (e.g., a display unit) through an interface. For example, the control unit 850 in conjunction with row decoder 840 can generate the activating signals. Moreover, in one embodiment, the control unit 850 can also generate the control signals to open and close the switches of the capacitor readout.

The control unit 850 may include one or more processors and one or more modules for executed the control algorithms described herein. The modules may be software modules running in the processor, or resident/stored in memory, one or more hardware modules coupled to the processor, or some combination thereof. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Furthermore, the control unit 850 may be coupled to a row decoder 840 that is configured to output the signals for selecting the rows in the pixel array 810 based on a control signal transmitted from the control unit 850. Moreover, the control unit can include an image generating unit configured to generate image data (i.e., the "data output") based on the stored sampled output values in the plurality of storage capacitors, i.e., the received "data signal", of which the generated image can be configured to be displayed on a display device as should be appreciated to one skilled in the art.

Preferably, the analog readout path and A/D converter 820 may include comparators as many as the number of columns of the pixel array 810 as described above. Each of the comparators serves a role of converting an analog pixel value of a column in which it is located into a digital signal. The digital signal is stored in the latch array unit 830 including latches as many as the number of the columns of the pixel array 810. The digital signals stored in the latch array unit 830 are subjected to an image processing by the control unit 850 and then, sequentially outputted through output pins of the image sensor in the image processed order.

According to the disclosure herein, the exemplary method and sensor provide for an efficient readout of pixel values from a pixel array that reduces the required output bandwidth and enables digital double sampling through the whole analog chain of the pixel array. Moreover, using the disclosed technique, effects like Black sun and fluctuating analog disturbances are avoided and suppressed.

In one configuration, to reduce interconnections in the pixel or pixel array, two transfer gates belonging to two different shared pixels (e.g., two shared pixels on two adjacent rows) may be connected. As a result, two floating diffusions of the two shared pixels are read out at the same time (e.g., during the same readout period). By cross coupling two transfer gates on two different rows, two shared pixels may be operated in parallel. This configuration may reduce the amount of wiring needed for the vertical shift registers for addressing the pixels or sub-pixels. For example, for a shared pixel with four photodiodes, the number of interconnections to address the shared pixel may be reduced from four wires to two wires. With reduced wiring in the shared pixel, the pixel performance (e.g., conversion gain, fill factor, sensitivity of the shared pixel) may improve due to lower complexity in wiring.

It should be appreciated that in the examples above, all switching signals are assumed to be positive logic signals, i.e. a high level, or "1" results in closing the switch. It is, however, also possible to use an inverted logic, or to use both, positive and negative, logic in a mixed manner. Moreover, the disclosed CMOS image sensor and method provides an increased speed of the overall readout circuit. In one aspect, the increase in the speed of the readout circuit allows for an increase in the number of pixels in a matrix, which is a key feature for high definition imaging.

Dynamic Pixel Management of a CMOS Image Sensor

Camera resolution and shutter operation determine, in part, the quality of a camera. Camera resolution can be related to the number of pixels used to capture an image while shutter operation can relate to how the exposed information is processed or read into memory. Camera resolution can further be classified into standards. For instance, a high definition (HD) standard can be based on a pixel area count of 1,920 by 1080 compared to an ultra-high definition (UHD) standard based on a pixel area count of 4,096 by 2160. Notably the UHD standard is also referred to as 4K-UHD and is four times the HD standard. Additionally, operating a camera for UHD as compared to operating a camera for HD can demand higher read rates when the camera uses a CMOS image sensor.

Shutter operation can be categorized by either a rolling line shutter sequence or a global shutter sequence. During a rolling shutter operation in a CMOS image sensor, the rows of a pixel array can be exposed and read sequentially; thus, there is delay between consecutive rows. The delay can, in turn, lead to picture distortion when the rate of the rolling shutter exposure and/or capture sequence is lower than the rate of the moving object. Global shutter can alleviate the distortion problem by exposing and storing all pixel data concurrently (globally). However, due to the way in which exposed pixels must be read row-by-row from a CMOS pixel array, successfully implementing global shutter with high signal to noise ratios can place a high demand on overall system bandwidth.

Due to the technical tradeoffs between system bandwidth and capturing moving images, a camera, video apparatus, and camera system is disclosed that offers all features of UHD, HD, rolling shutter, and global shutter with the functionality to convert from one resolution to another. Thus, as will be described in detail below, an apparatus and method for dynamic pixel management (DPM) of a cross pixel interconnected CMOS image sensor are disclosed. In the exemplary aspects, the cross pixel interconnected CMOS image sensor can be used as described above in FIGS. 2-6, to provide a camera system that provides an advanced DPM scheme for combining HD, UHD, rolling shutter, and global shutter.

Figure 9:
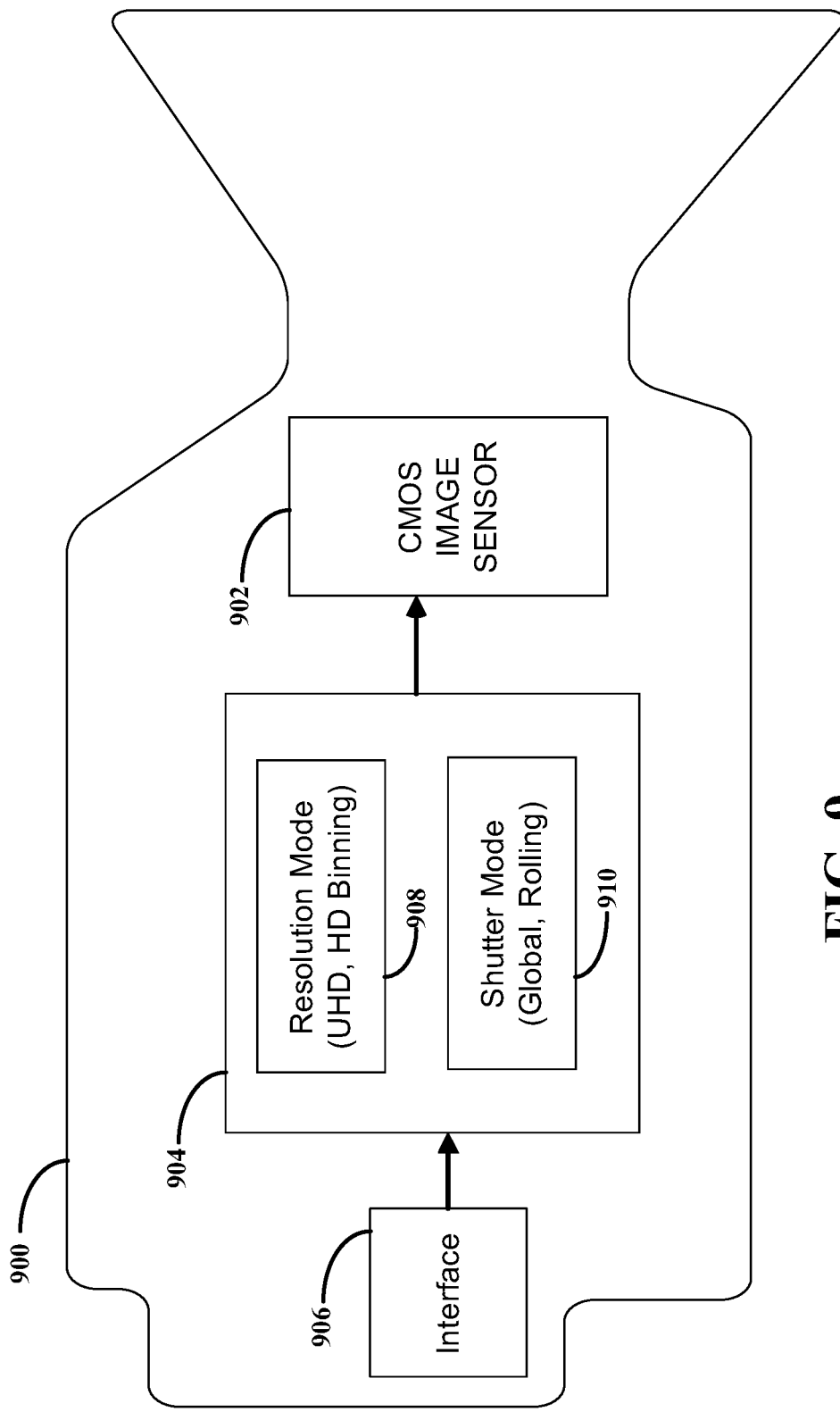
FIG. 9 illustrates a camera system diagram for dynamic pixel management of a CMOS image sensor according to an embodiment.

FIG. 9 illustrates a camera system diagram 900 for dynamic pixel management of a CMOS image sensor 902 according to an embodiment. The camera system diagram 900 includes an interface 906, a dynamic pixel management (DPM) module 904, and the CMOS image sensor 902. The DPM module 904 includes a resolution sub-block 908 and a shutter mode sub-block 910. A user can select a camera feature and/or option via the interface 906. The interface 906 can allow the user to enter a feature selection via an external control panel or via an integrated camera menu. Based on information provided by the user, the DPM module 904 and the sub-blocks 908, 910 can control the CMOS image sensor 902 to transfer and read pixels according to an HD or UHD resolution mode and according to a rolling shutter or global shutter exposure sequence. Effectively, the interface 906 and/or dynamic pixel manager 904, can collectively operate as a camera controller configured to switch the camera between a selected UHD mode and a HD mode based on a selected image resolution for an image capture. In turn, as will be described in detail below, the image sensor individually samples sub-pixels of each pixel in an image sensor when the camera mode controller sets the camera to the UHD mode for the image capture and collectively samples the sub-pixels of each pixel in the image sensor when the camera mode controller sets the camera to the HD mode for the image capture.

The camera user can additionally choose a video format based, at least in part, on active lines and video modes. An exemplary camera using DPM can include selections for a plurality of video formats including 1080P50, 1080P59, 1080P150, 1080P179, 1080i300, 1080i359, 4K50, and 4K50. Here 1080, 4K, "P", and "i" can represent HD pixels (1080), 4K-UHD pixels (4096), "Progressive", and "interlaced," while the numbers including 50, 59 can relate to framerates.

Figure 10:
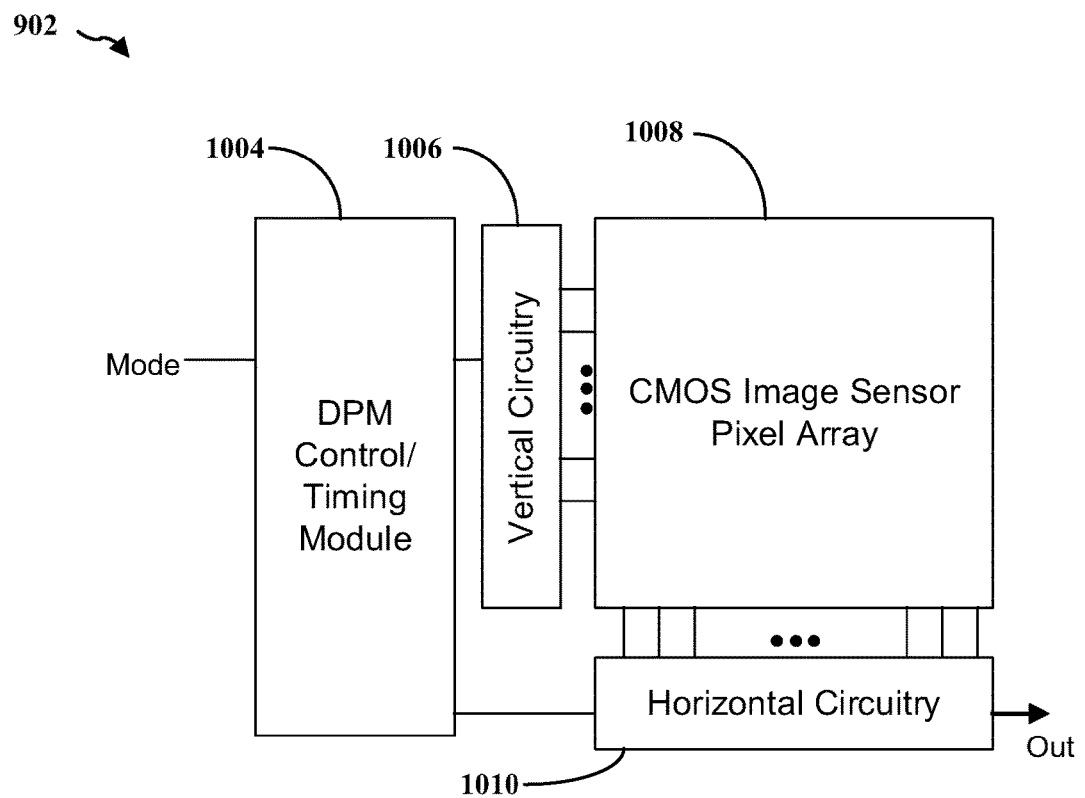
FIG. 10 illustrates a system architecture of a CMOS image sensor according to an embodiment.

FIG. 10 illustrates a system architecture of a CMOS image sensor 902 according to an embodiment. The CMOS image sensor 902 includes a dynamic pixel manager or DPM module 1004, vertical circuitry 1006, a CMOS image sensor array 1008, and horizontal circuitry. The CMOS image sensor array 1008 can be a cross pixel interconnected sensor array as described herein and can also be referred to as a shared pixel sensor array. The DPM module 1004 can receive one or more signals indicating a user selected "Mode". For instance, the user may select a camera feature "Mode" from the plurality video formats 1080P50, 1080P59, 1080P150, 1080P179, 1080i300, 1080i359, 4K50, and/or 4K50, as described above.

The DPM module 1004 can be realized with one or more elements within the CMOS image sensor to control sub-pixels of the CMOS image sensor array 1008. For instance, when the user selects 4K50, the DPM module 1004 can determine the operation mode (i.e., HD vs. UHD as selected for the preferred resolution of the captured image, for example) provide control signals to the vertical circuitry 1006 and to the horizontal circuitry 1010 so that sub-pixels of the CMOS image sensor array 1008 (photodiodes) are read sequentially and in a rolling shutter mode. Alternatively, if a video format indicating an HD "Mode" is selected, then the DPM module 1004 can provide signals to the vertical circuitry 1006 and to the horizontal circuitry 1010 so that sub-pixels of the CMOS image sensor array 1008 (photodiodes) are binned together and read in either a rolling shutter or horizontal shutter mode.

According to the exemplary aspect, the dynamic pixel manager can implement a number of controllers, include a UHD mode controller and a HD mode controller that are configured to perform the pixel (sub-pixel or photodiode) sampling as described herein. For example, the UHD mode controller can be configured to control the plurality of vertical and horizontal charge circuitry to sequentially transfer charge between the at least two photodiodes and the shared floating diffusion of each shared pixel unit when the dynamic pixel manager sets the operational mode of the CMOS image sensor to the UHD mode to individually sample output values of each of the at least two photodiode during the image capture by the image sensor. Moreover, the HD mode controller configured to control the plurality of vertical and horizontal charge circuitry to bin charge concurrently between the at least two photodiodes and the shared floating diffusion of each shared pixel unit when the dynamic pixel manager sets the operational mode of the CMOS image sensor to the HD mode to collectively sample output values of each shared pixel unit that combines output values of the at least two photodiodes during the image capture by the image sensor. In one exemplary aspect, these controllers can be implemented as part of control unit 850 described above.

Although the system architecture of the CMOS image sensor 902 shows an architecture having four system blocks (the DPM module 1004, the vertical circuitry 1006, the horizontal circuitry 1010, the CMOS image sensor array 1008), other configurations are possible. As one of ordinary skill in the art can appreciate, the vertical circuitry 1006 can comprise circuit blocks for controlling rows of the CMOS image sensor array 1008 and the horizontal circuitry 1010 can comprise circuit blocks for reading and processing columns of the CMOS image sensor array 1008. For instance, vertical and horizontal circuitry 1006, 1010 can include shift registers. Also, horizontal circuitry 1010 can include noise cancellation circuitry for use with digital double sampling and can also include analog to digital (A/D) converters, digital signal processors (DSPs), memory, and the like. The horizontal circuitry can provide output data "OUT" in a format suitable for reading in digital and analog formats.

The DPM module 1004 can include timing circuit blocks including but not limited to phase locked loops (PLLs) and serial/parallel interface components. In other configurations timing circuit blocks including PLLs can be external to the DPM module 1004. As one of ordinary skill in the art can appreciate, DPM functionality, as represented by the DPM module 1004, can be implemented with both software and hardware and can be realized with one or more circuit components including microprocessors and/or controllers.

FIG. 11A illustrates a schematic diagram of a shared pixel unit 1100 according to an embodiment. A 4T shared pixel sensor can also be referred to as a shared pixel unit 1100; and the shared pixel unit 1100 can be equivalent to the exemplary 4T shared pixel CMOS image sensor of FIG. 2. However, the components and signal inputs have been arranged to facilitate discussion of timing diagrams. The shared pixel unit 1100 includes sub-pixels An, Bn, Cn, and Dn, each electrically coupled between ground and a storage node of floating diffusion FDn for an N-th row (n-th row) within a shared pixel array. As shown in FIG. 11A, the floating diffusion FDn is modeled as a capacitor $C_{fd}$. Also, the storage node is electrically coupled to a source of reset transistor MN5 and to a gate of source follower transistor MN6. The select transistor MN7 is coupled between the source of transistor MN6 and the column buss "COLUMN".

The sub-pixels An, Bn, Cn, and Dn, are shared pixel units and each includes a photodiode (PD0-PD3) and a gate transistor (MN0-MN3). As discussed above with respect to FIG. 2 and as shown in FIG. 11A, the gate nodes (gates) of transistors (MN0-MN3) each receive a transfer gate signal TG0(N)-TG3(N). Also, the gate of reset transistor MN5 receives a reset signal RST(N) and the gate of the read select transistor MN7 receives a select signal SEL(N). The index "N" indicates the signals are applied to the gates of the pixel array unit of row N (row n). As detailed in FIG. 11B, each sub-pixel An, Bn, Cn, and Dn, can be realized by a composite layout of a gate between the floating diffusion FDn and a diffusion of a photodiode (PD0-PD3).

FIG. 11B illustrates a partial cross-sectional device diagram 1103 of a shared pixel unit according to the embodiment of FIG. 11A. The partial cross-sectional device diagram 1103 shows includes a simplified cross section representation of diffusions 1105, 1106, 1107 and interconnect relating to sub-pixels Cn, Dn and floating diffusion FDn. In FIG. 11B the diffusions 1105 and 1107 can represent N-type diffusions of photodiodes PD0 and PD1, respectively forming junctions in P-epitaxial layer 1108; and diffusion 1106 can represent the N-type diffusion forming a storage depletion layer capacitor $C_{fd}$ in floating diffusion FDn. As shown in FIG. 11B, transistor MN0 can be formed by the gate 1114 between diffusions 1105 and 1106, and transistor MN1 can be formed by the gate 1112 between diffusions 1107 and 1106.

As one of ordinary skill in the art can appreciate, when the gate TG0(N) receives a signal or voltage causing an inversion region between diffusions 1105 and 1106, charge can be transferred between the diffusions 1105 and 1106. Similarly, when the gate 1114 receives a signal or voltage TG1(N) causing an inversion region between diffusions 1107 and 1106, charge can transferred between the diffusions 1107 and 1106. Referring to FIG. 11A, it can be said that charge is transferred between photodiode PD0,1 and the floating diffusion FDn when the transfer gates exert a logic "high".

FIG. 11C illustrates a symbol diagram 1120 of the shared pixel unit according to the embodiment of FIG. 11A. The symbol diagram 1120 shows a hierarchical schematic symbol representation of the schematic of FIG. 11A. As one of ordinary skill in the art can appreciate, the symbol diagram can be a convenient way to show the sub-pixels and their connection with the gating signals TG0(N)-TG3(N), the row select signal SEL(N), and the row reset signal RST(N).

Figure 12:
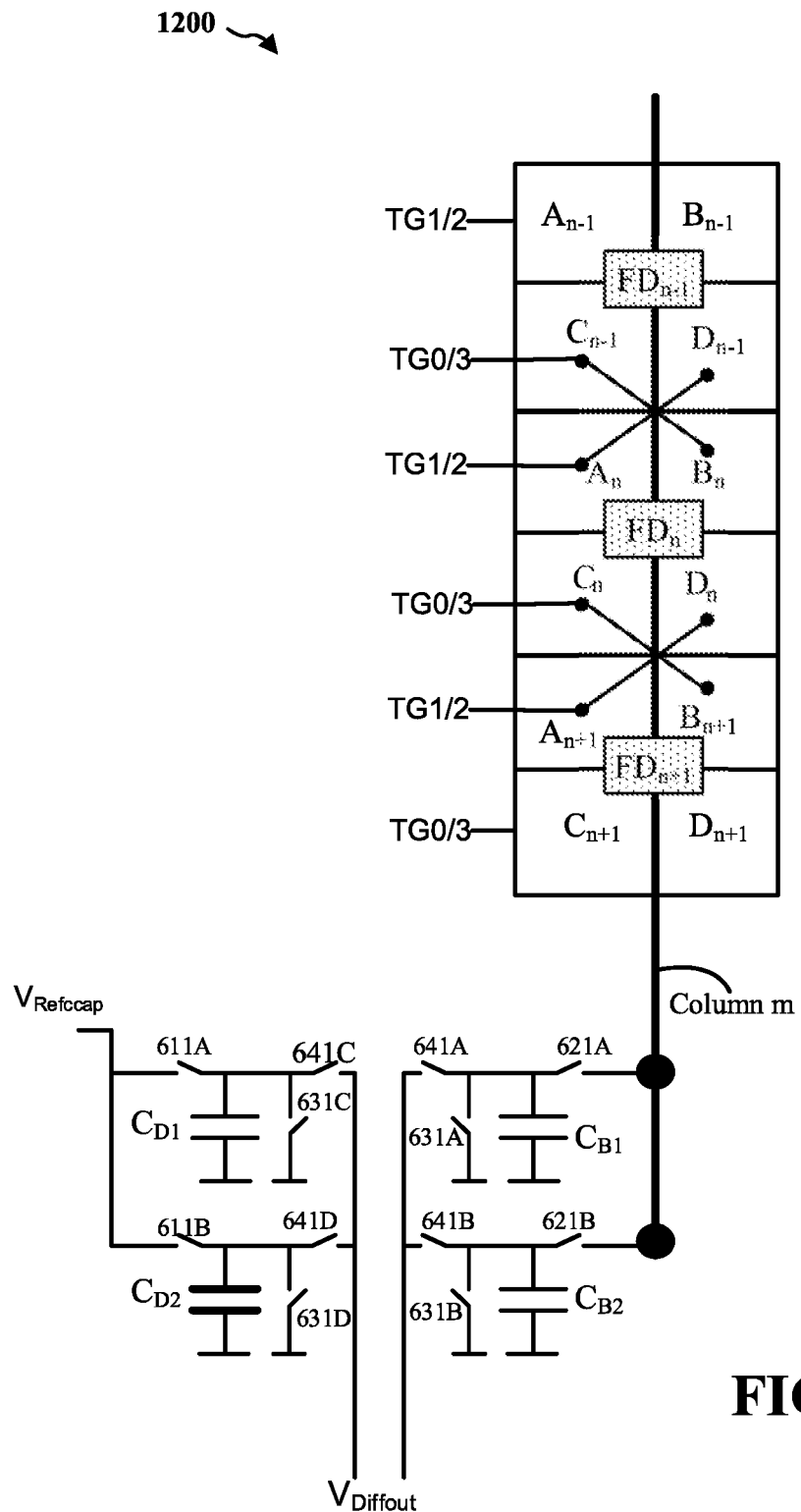
FIG. 12 illustrates features of a column circuit with shared pixel units according to an embodiment.

FIG. 12 illustrates features of a column circuit 1200 with shared pixel units according to an embodiment. The column circuit 1200 of FIG. 12 can be equivalent to the conceptual view of the pixel array portion of FIG. 4, except further details of the signals have been included to facilitate discussion of the timing diagrams; also, FIG. 4 introduces noise cancellation circuitry. The column circuit 1200 of FIG. 12 shows three pixel array units for rows N−1, N, and N+1, (also referred to in the lower-case as rows n−1, n, and n+1). The row N−1 pixel array unit includes sub-pixels $A_{n-1}$, $B_{n-1}$, $C_{n-1}$, and $D_{n-1}$. The row N pixel array unit includes sub-pixels $A_n$, $B_n$, $C_n$, and $D_n$; and the row N+1 pixel array unit includes sub-pixels $A_{n+1}$, $B_{n+1}$, $C_{n+1}$, and $D_{n+1}$.

Similar to the column circuit of FIG. 4, the pixel array units for the N−1, N, and N+1 rows have a crisscross interconnect pattern advantageously allowing gate signals to be combined. As shown in FIG. 12, the transfer gate signals have been combined. For instance, the sub-pixel $A_{n+1}$ and the sub-pixel $D_n$ are shown to receive a signal TG1/2 (combining TG1(N+1) with TG2(N)), and the sub-pixel $B_{n+1}$ and the sub-pixel $C_n$ are shown to receive a signal TG0/3 (combining TG0(N) with TG3(N+1)). As can be understood from the timing diagrams, a subscript for the rows has been dropped in the labelling. For instance, as will be explained with respect to the timing diagrams, the signal TG1/2 corresponding to sub-pixels $A_{n+1}$ and $D_n$ can be sequenced independently of the signal TG1/2 corresponding to sub-pixels $A_n$ and $D_{n-1}$. Similarly, the signal TG0/3 corresponding to sub-pixels $B_{n+1}$ and $C_n$ can be sequenced independently of the signal TG0/3 corresponding to sub-pixels $B_n$ and $C_{n-1}$.

FIG. 12 also shows a switched capacitor approach for providing differential digital double sampling (dDDS) and digital double sampling (DDS). As shown, the circuit includes four capacitors CD1, CD2, CB1 and CB2 that are provided to store the video level and the dark level for the digital double sampling. In particular, two "bright" capacitors (i.e., capacitors CB1 and CB2) are provided to sample the video level and two "dark" capacitors (i.e., capacitors CD1 and CD2) are provided to sample the reference level. Thus, as shown, capacitors CD1 and CD2 are coupled to a capacitor reference voltage to readout a fixed value from the reference voltage while capacitors CB1 and CB2 are coupled to the bitline (column m) of the pixel array to sample the pixel voltages of the dark, bright and double bright values of each pixel output (i.e., the video level). The readout path is fully differential and the connection of each capacitor depends on the mode of operation as will be described in detail below.

At the end of column line (column m), there are two switches, 621A and 621B for selectively connecting the output of the pixel array to storage capacitors CB1 and CB2 to sample the dark, bright and double bright values, respectively, from the pixel array. Moreover, the readout circuit includes are two more switches, 611A and 611B for selectively connecting the storage capacitors CD1 and CD2 to a reference voltage for the capacitors. Each of the capacitors CB1, CB2, CD1 and CD2 is respectively connected in parallel to a reset switch 631A, 631B, 631C and 631D, in order to reset the capacitors to a previous value to GND (ground). Moreover, column selection switches 641A-641D are respectively provided between the storage capacitors and a bus bar (not shown) that ultimately outputs the measured differential voltages to an A/D converter (also not shown) and then to a buffer. Thus, the column selection switches 641A-641D are controlled to output stored signals from storage capacitors CD1, CD2, CB1 and CB2 to one of the columns at a time to the bus bar. Each of the pixels is activated at a given time by a row decoder.

Advantageously, using this design, the sampling of the pixel output voltage from the pixel array is decoupled from the A/D conversion. The decoupling enables high speed readout of the pixel output voltages by putting these two actions in parallel instead of serial operation.

Figure 13A:
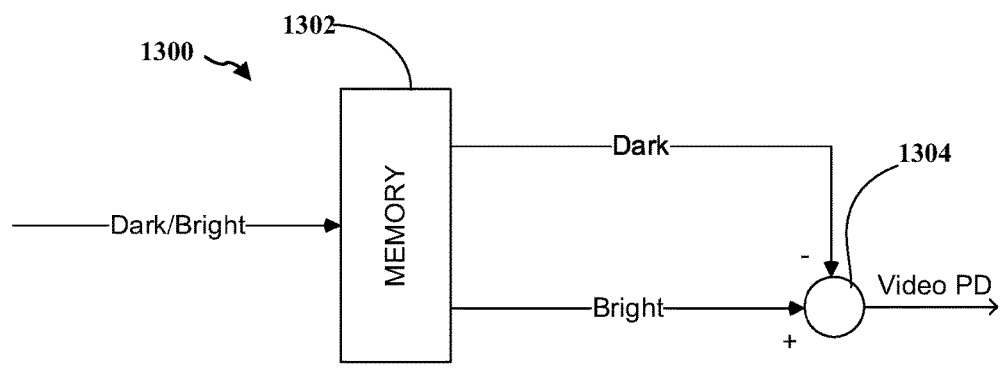
FIG. 13A illustrates a control diagram for subtracting noise according to an embodiment.

FIG. 13A illustrates a control diagram 1300 for subtracting noise according to an embodiment. The control diagram 1300 includes memory 1302 and a summing block 1304 for using a DDS scheme. The memory 1302 receives a digital representation of a dark (DARK) and/or a bright (BRIGHT) signal. The dark signal can be a digital symbol representation of column data read following a reset of a pixel and prior to exposure of a sub-pixel photodiode. A bright signal can represent a digital symbol representation of column data read following the exposure and transfer of charge between a photodiode and floating diffusion within a shared pixel unit. After a floating diffusion is reset, a value (DARK) is sampled on a column, such as column m of FIG. 11A, and stored on a column capacitor. An analog to digital converter can convert the signal and the digital symbol can then be stored into the memory 1302. After a transfer pulse (TG) such as TG0/3 or TG1/2 is exerted, a bright signal from the floating diffusion is again read out (BRIGHT) and the two values are subtracted at the summing block 1304 to provide a reduced noise video signal (Video PD). This can advantageously remove noise and additional components of random and systematic offset inherent in electronic systems. The control diagram 1300 can be implemented in a DSP and/or controller using digital symbols from A/D conversion of analog pixel data. The pixel data can be pixel data read from the columns such as column m of FIG. 12.

Figure 13B:
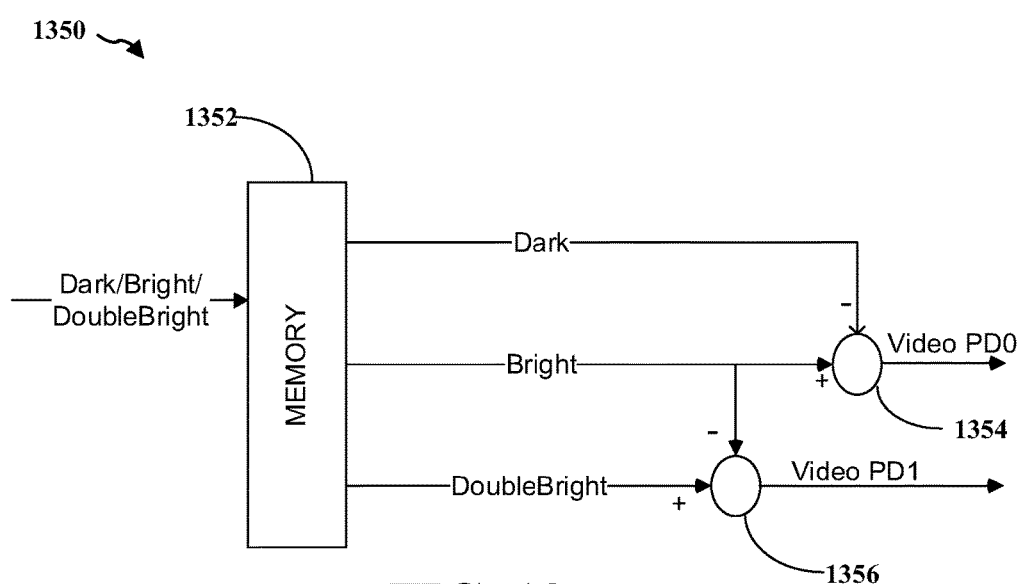
FIG. 13B illustrates a control diagram for subtracting noise according to another embodiment.

FIG. 13B illustrates a control diagram 1350 for subtracting noise according to another embodiment. The embodiment of FIG. 13B is similar to that of FIG. 13A except the control diagram 1350 includes an additional summing junction to implement differential DDS. The control diagram 1350 includes memory 1352, a summing block 1354, and a summing block 1356 to implement a differential DDS (dDDS) scheme. The memory 1352 is shown to receive a digital representation of a dark (DARK), bright (BRIGHT), and double bright (DOUBLEBRIGHT) signal. A bright signal can represent a digital symbol representation of column data read following the exposure and transfer of charge between a photodiode and floating diffusion within a shared pixel unit. After a floating diffusion is reset, a value (DARK) is sampled on a column, such as column m of FIG. 11A, and stored on a column capacitor. An analog to digital converter can convert the signal which is then stored into the memory 1352.

After a transfer pulse (TG) such as TG0/3 or TG1/2 is exerted, a bright signal from the floating diffusion is again read out (BRIGHT) and the two values are subtracted at the summing block 1354 to provide a reduced noise video signal (Video PD0). Following the read of the bright signal, another read operation can be performed to read out another sub-pixel superimposed upon the previous bright (BRIGHT) signal to provide a double bright (DOUBLEBRIGHT) signal. The bright signal can then be subtracted from the double bright signal in summing block 1356 to provide a second reduced noise video signal (Video PD1). This advantageously provides two reduced noise signals; and the timing sequence for differential DDS (dDDS) can advantageously reduce the output raw data rate. Instead of requiring twice the data-rate as compared to an analog double sampling readout scheme, the dDDS scheme can reduce the output raw data rate by using the Dark, Bright and Double Bright values to reconstruct two pixels Video PD0 and Video PD1 with reset-noise suppression each.

Figure 14A:
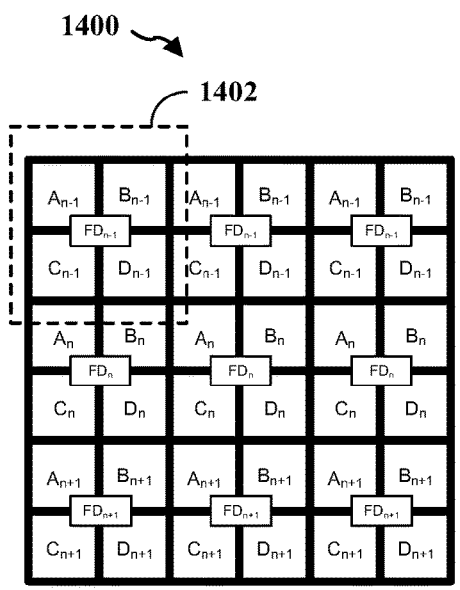
FIGS. 14A-B illustrate a comparison of a pixel array using an ultra-high definition (UHD) resolution mode with a pixel array using a high definition (HD) resolution mode according to dynamic pixel management (DPM) embodiments.
Figure 14B:
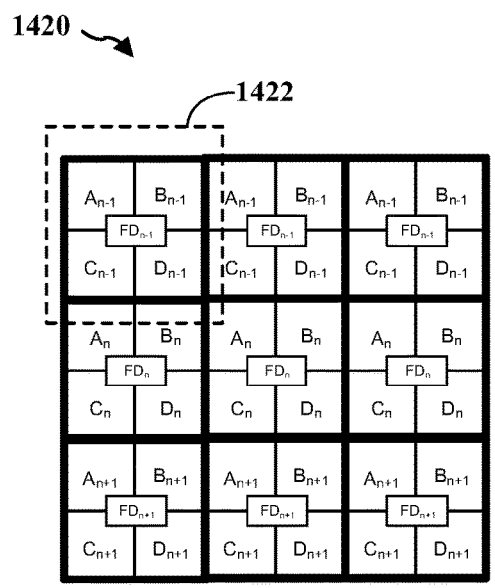

FIGS. 14A-B illustrate a comparison of a pixel array 1400 using an ultra-high definition (UHD) resolution mode with a pixel array 1420 using a high definition (HD) resolution mode according to dynamic pixel management (DPM) embodiments. As illustrated by the pixel array unit 1402, in UHD mode the sub-pixels $A_{n-1}$, $B_{n-1}$, $C_{n-1}$ and $D_{n-1}$ can be transferred to their floating diffusion point $FD_{n-1}$ for individual readout along a column bit-line (column). As depicted, this allows a four times higher spatial resolution compared to the HD readout mode of pixel array 1420. In UHD mode readout can be either use DDS or dDDS.

Pixel array 1420 depicts pixel binning. As illustrated by the pixel array unit 1422, in HD mode the sub-pixels $A_{n-1}$, $B_{n-1}$, $C_{n-1}$ and $D_{n-1}$ can be transferred (binned) to their floating diffusion point $FD_{n-1}$ concurrently for a combined sub-pixel readout along a column bit-line (column). The sub-pixels are binned in parallel to create a larger pixel having effectively four times the area of a sub-pixel. This can advantageously provide for a better pixel with more exposure surface area at the expense of lower overall pixel resolution. In pixel binning, four photo diodes are readout at once. Charge from four photo diodes is are binned (collected) at the floating diffusion node $FD_{n-1}$.

Charge domain binning can increase sensitivity proportional to the number of pixels binned. In the pixel array 1420 configured for HD readout, the pixel read noise can be the same as the read noise in the pixel array 1400. Thus, there can be an increase in performance by a factor of four. In addition the read-out speed can also increase by a factor of four, since one instead of four pixels are read. Advantageously, in HD mode both global shutter and rolling shutter sequencing can be implemented.

Figure 15A:
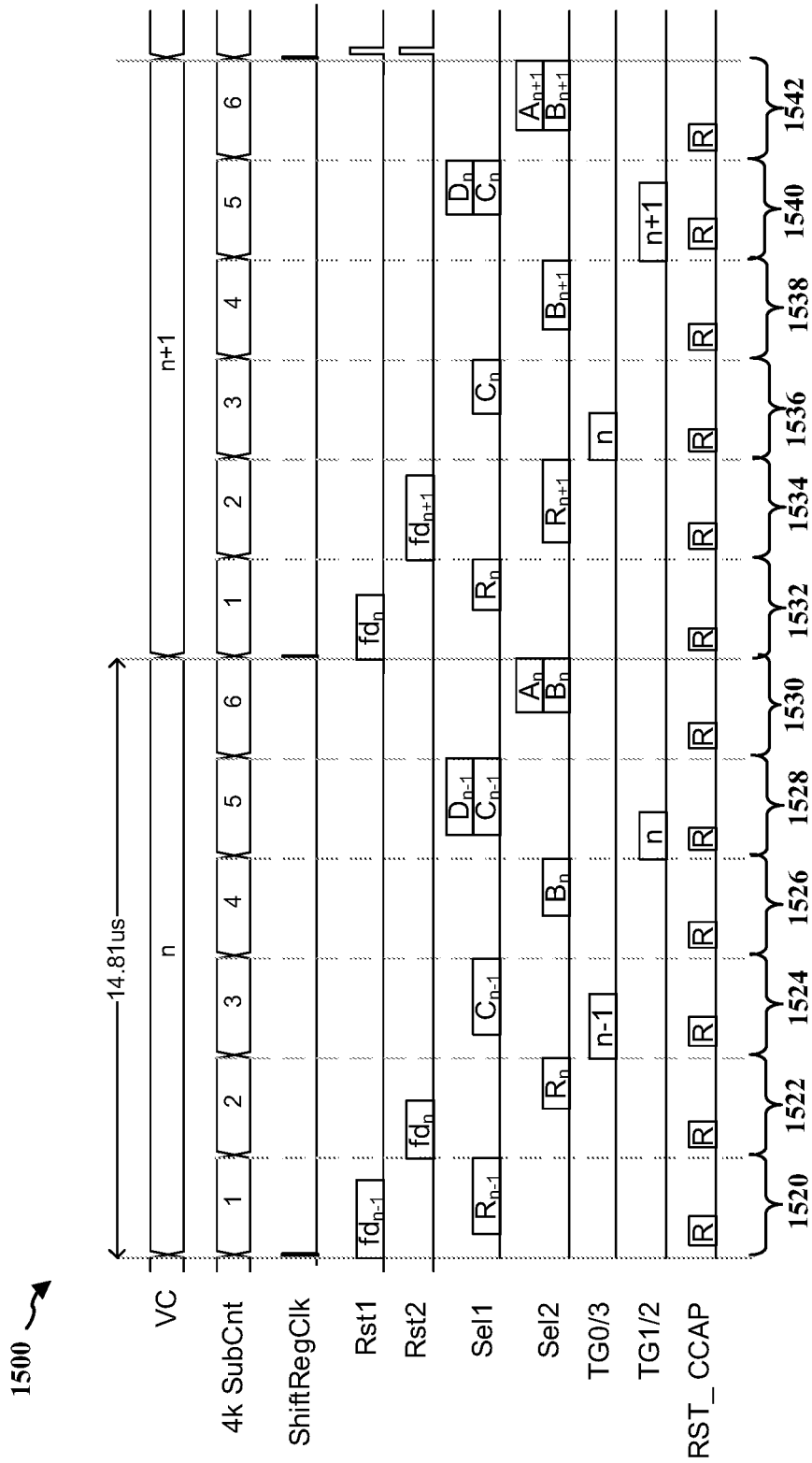
FIG. 15A illustrates a pixel timing readout scheme of signals corresponding to an ultra-high definition (UHD) mode with differential digital double sampling (dDDS) according to an embodiment.
Figure 15B:
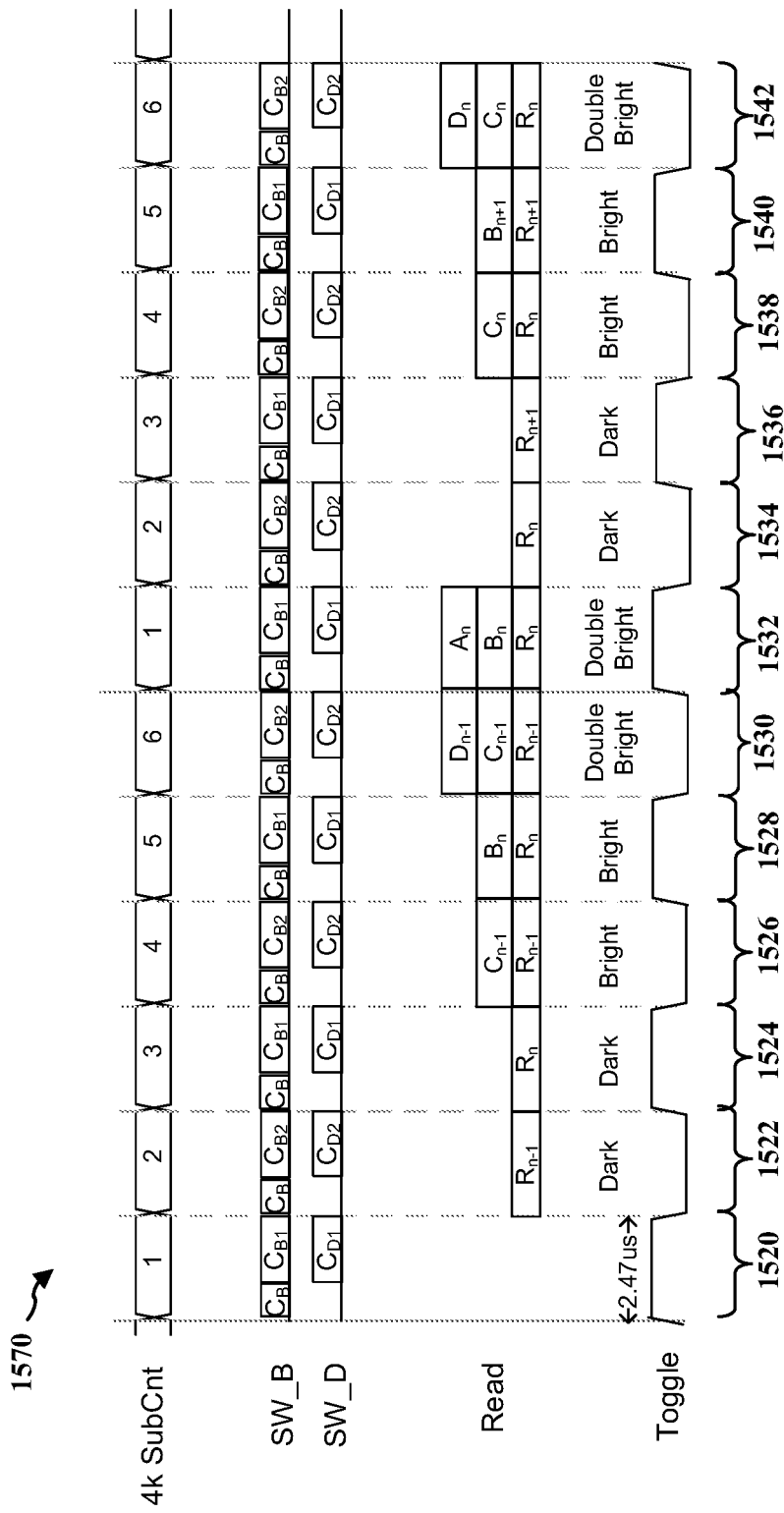
FIG. 15B illustrates a pixel timing readout scheme of additional signals corresponding to the embodiment of FIG. 15A.

FIG. 15A illustrates a pixel timing readout scheme 1500 of signals corresponding to an ultra-high definition (UHD) mode with differential digital double sampling (dDDS) according to an embodiment. FIG. 15B illustrates the pixel timing readout scheme 1570 of additional signals corresponding to the embodiment of FIG. 15A.

The readout schemes 1500, 1570 can illustrate horizontal timing of a pixel array having a crisscross interconnect pattern for providing differential digital double sampling. As shown, the horizontal readout schemes 1500, 1570 can be based on a counter to provide cycles of six sub-counts as indicated by signal "4K SubCnt". The timing diagram time axis is therefore shown to be partitioned into counter based cycles labelled 1520-1542. In this regard, the counter performs the count operation in synchronization with clocks having a fixed period; for instance, a shift register clock signal "ShiftRegClk" is shown to provide a clock pulse every six cycles. Also, in regard to the counter based cycles, during each cycle 1520-1542 a column capacitor is reset via the signal "RST_CCAP".

In one embodiment, the readout can performed in accordance with the 1080p standard with each readout (i.e., each clock cycle) being performed at 14.81 μs as indicated by the VC signal index. After each readout cycle, there can be six values that are obtained, two dark values, two bright values, and two double bright values. After the differential digital double sampling technique is applied using these values, corrected digital outputs of four pixels can be obtained, which generates a 4 k/UHD standard.

For purposes of illustration, the timing diagram is annotated in accordance with the sub-pixels illustrated in FIG. 12 discussed above. As shown, during a first count value 1520, a reset signal Rst1 can be applied to a row n−1, and more particularly, to reset a floating diffusion $fd_{n-1}$ ($FD_{n-1}$). Preferably, the reset signals have a width of 22 clocks at 222 MHz or 99 nanoseconds. During this same count, a select signal Sel1 is applied to row n−1, i.e., $D_{n-1}$. Preferably, the select signals have a width of 210 clks at 222 MHz or 943 nanoseconds. Similarly, during a second count value 1522, a reset signal Rst2 is applied to row n, i.e., to floating diffusion point $fd_n$ ($FD_n$) and a select signal Sel2 is applied to row n, i.e., to $D_n$. Thus, it should be appreciated that in accordance with the dDDS filtering technique, each of rows n−1 and n have been reset such that digital data for each pixel can obtained. This is shown in the readout row (i.e., "READ") in which the dark values $R_{n-1}$ and $R_n$ are read out from the pixel array during counts 2 and 3 of the clock cycle.

In general, the timing diagram illustrates that the capacitors are reset by RST_CCAP value at the top of each count and the control signal SW_B for capacitors CB1 and CB2 and the control signal SW_D for capacitors CD1 and CD2 are continuously applied to sample the date on the bitline (column) as should be understood to those skilled in the art. The resetting and sampling of these capacitors will not be described for each separate count in the cycle.

Once the dark values $R_{n-1}$ and $R_n$ are sampled at counts 1 and 2 (count period 1520 and 1522), and readout at counts 2 and 3 (1522 and 1523), the timing continues to count 3 (1523) of the cycle. As shown, a transfer gate TG0/3 is applied to activate the corresponding sub-pixel in rows n−1 and n. For example, this transfer gate signal TG0/3 can activate sub-pixels $C_{n-1}$ and $B_n$. Thus, when select signal Sel1 is applied again to row n−1, sub-pixel $C_{n-1}$ can be readout as further shown during count 4 (1526). Similarly, when select signal Sel2 is applied again to row n, sub-pixel $B_n$ can be readout as further shown during count 5 (1528). Preferably, the transfer gate signals have a width of 320 clocks at 222 MHz or 1437 nanoseconds.

Furthermore, during count 5 (1528), a transfer gate TG1/2 can be applied to activate the corresponding sub-pixels in row n and n−1. This transfer gate signal TG1/2 can activates sub-pixels $D_{n-1}$ and $A_n$. Thus, when select signal Sel1 is applied again to row n−1, a double bright value of both sub-pixel $C_{n-1}$ and $D_{n-1}$ can be readout as further shown during count 6 (1530). Similarly, when select signal Sel2 is applied again to row n, a double bright value of sub-pixel $B_n$ and sub-pixel $A_n$ can be readout as further shown during count 1 of the next clock cycle (1532). Accordingly, during this counter cycle, the readout circuit has sampled values from sub-pixels $C_{n-1}$ and $B_n$ and double bright values from sub-pixels $C_{n-1}$ and $D_{n-1}$ and from sub-pixels $A_n$ and $B_n$. As described above with respect to FIGS. 13A and 13B, the values for sub-pixels $D_{n-1}$ can be determined by removing the value of $C_{n-1}$ from the double bright value. Similarly, the values for sub-pixels $A_n$ can be determined by removing the value of $B_n$ from the double bright value.

Figure 16A:
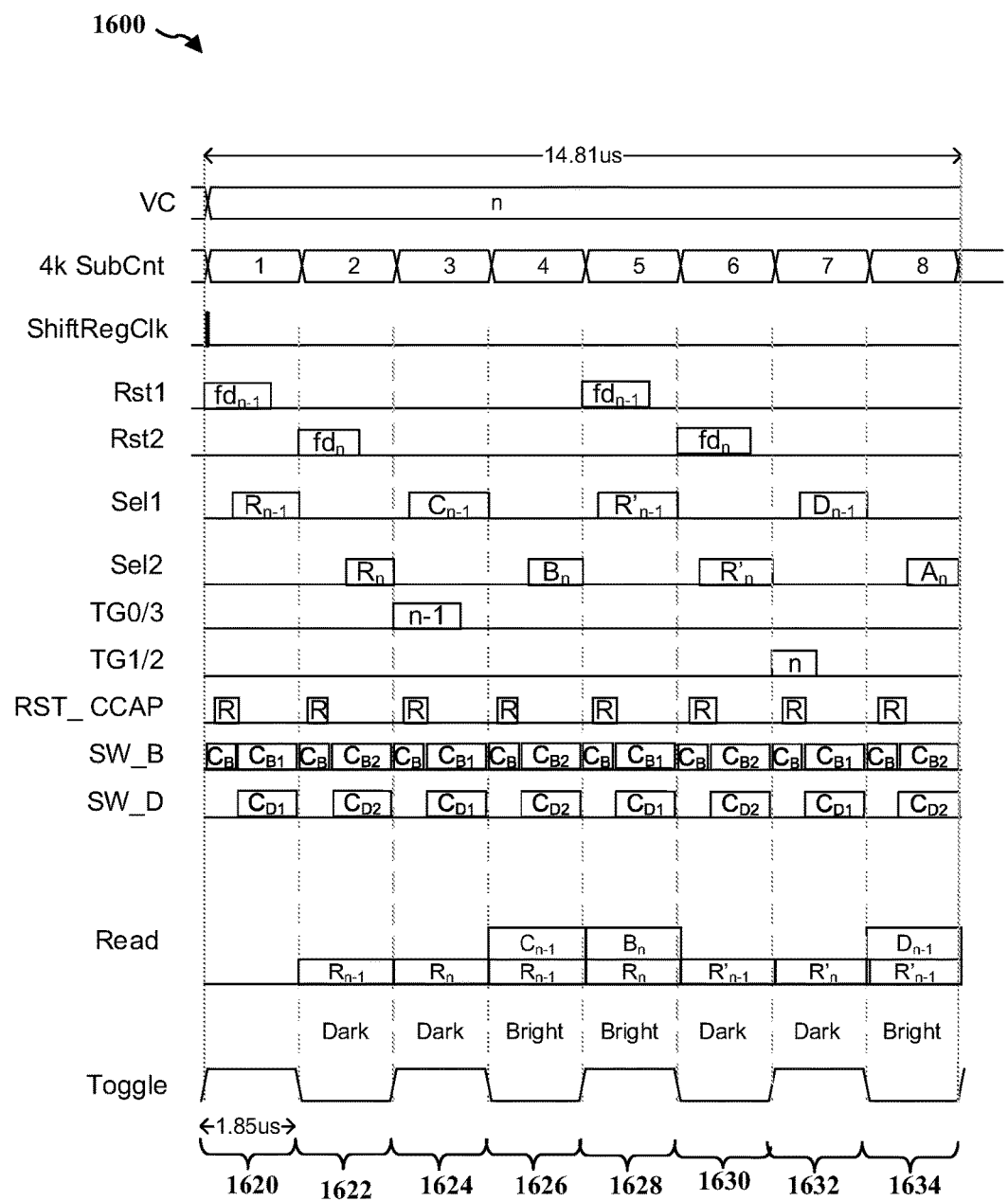
FIG. 16A illustrates a partial pixel timing readout scheme of signals corresponding to an ultra-high definition (UHD) mode with digital double sampling (DDS) according to an embodiment.
Figure 16B:
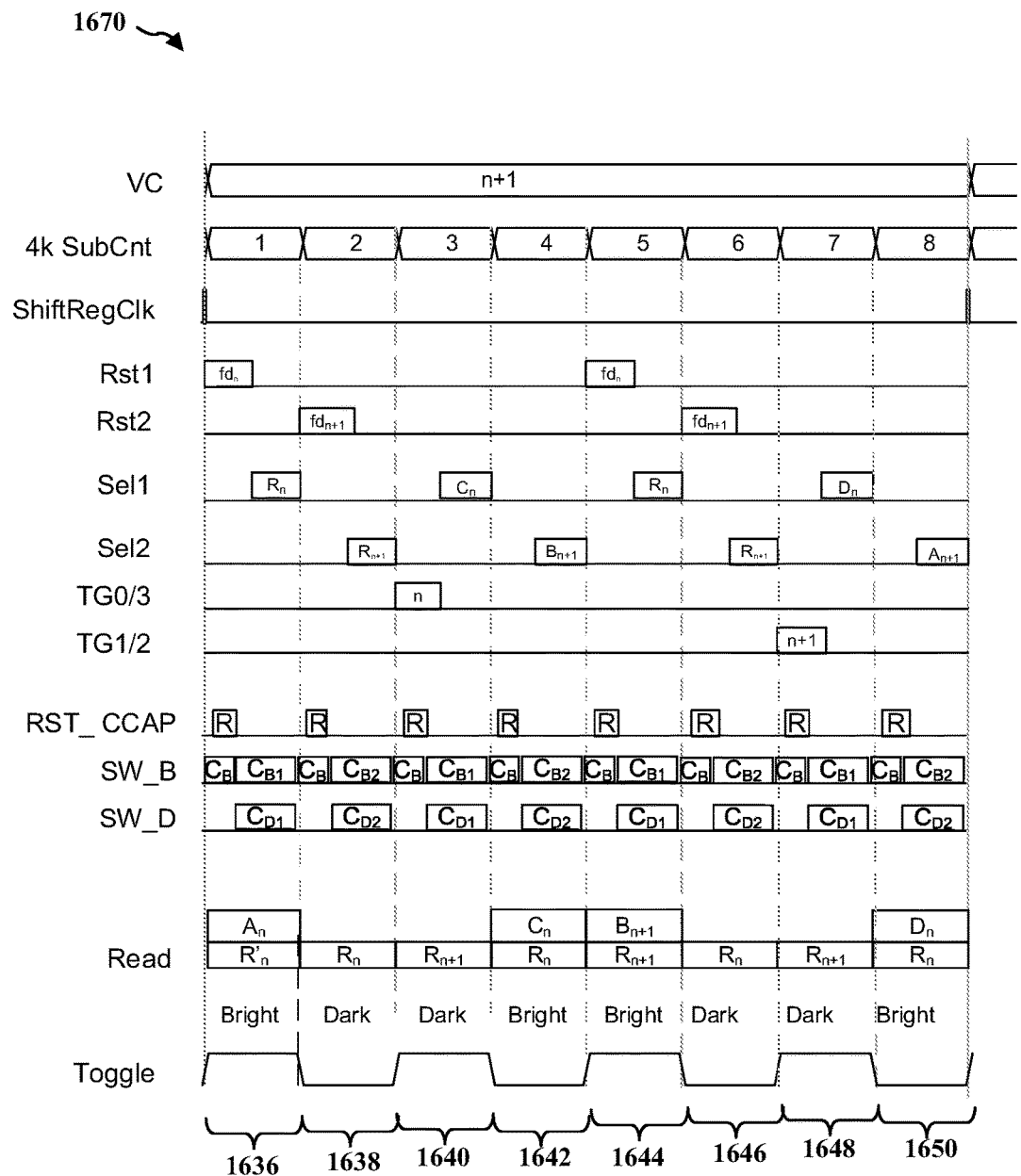
FIG. 16B illustrates a partial pixel timing readout scheme of signals corresponding to the embodiment of FIG. 16A.

FIG. 16A illustrates a partial pixel timing readout scheme 1600 of signals corresponding to an ultra-high definition (UHD) mode with digital double sampling (DDS) according to an embodiment. FIG. 16B illustrates a partial pixel timing readout scheme 1670 of signals corresponding to the embodiment of FIG. 16A. Unlike the readout schemes 1500, 1570, the readout schemes 1600, 1670 show timing diagrams for DDS which is portioned over eight cycles instead of six. The timing diagram time axis, portioned over counter based cycles labelled 16 is therefore shown to be partitioned into counter based cycles labelled 1620-1650. In this regard, the counter performs the count operation in synchronization with clocks having a fixed period; for instance, a shift register clock signal "ShiftRegClk" is shown to provide a clock pulse every eight cycles.

As shown in the readout schemes 1600 and 1670, over a period of eight cycles (1620-1634) of 1.85 us duration, DDS can be implemented in UHD mode. Referring to the "Read" data, the DDS cycles can be implemented so as to read a dark value $R_{n-1}$ during cycle 2 (1622), a dark value $R_n$ during cycle 3 (1624), a bright value $C_{n-1}$ during cycle 4 (1626), and a bright value $B_n$ during cycle 5 (1628). The dark value $R_{n-1}$ can be subtracted from the bright value $C_{n-1}$, and the dark value $R_n$ can be subtracted from the bright value $B_n$ using DDS as depicted in FIG. 13A. As shown, this process of reading in sequence a Dark, Dark, Bright, and Bright signal continues until a total of seven sub-pixel $C_{n-1}$, $B_n$, $D_{n-1}$, $A_n$, $C_n$, $B_{n+1}$, $D_n$. and $B_n$ are read. In this way DDS can be applied each of the seven sub-pixel $C_{n-1}$, $B_n$, $D_{n-1}$, $A_n$, $C_n$, $B_{n+1}$, $D_n$. and $B_n$ values.

Figure 17:
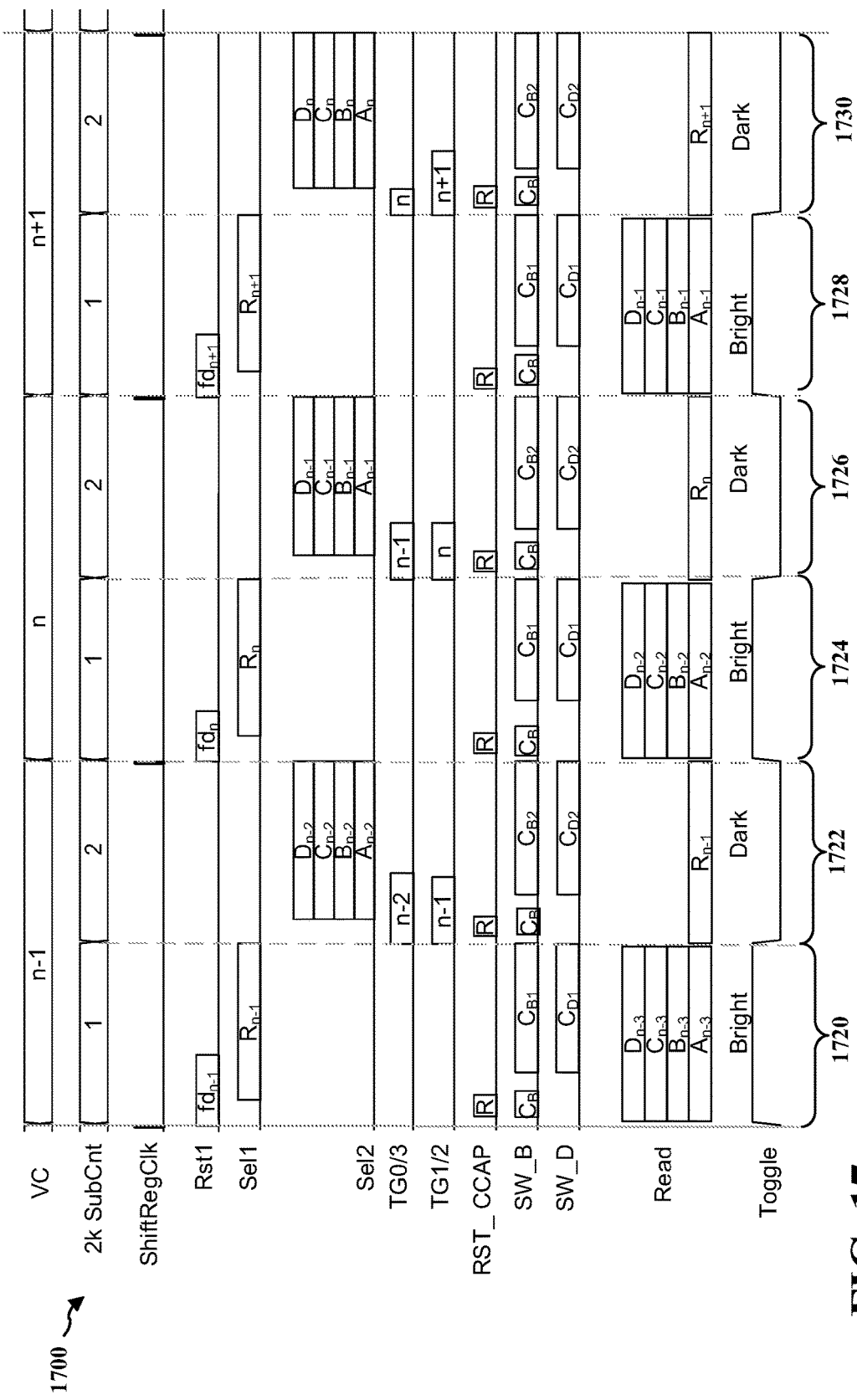
FIG. 17 illustrates a pixel timing readout scheme of signals corresponding to a high definition (HD) mode with digital double sampling DDS according to an embodiment.

FIG. 17 illustrates a pixel timing readout scheme 1700 of signals corresponding to a high definition (HD) mode with digital double sampling DDS according to an embodiment. The pixel timing readout scheme 1700 shows a timing scheme where sub-pixels are binned concurrently and DDS is applied to the read values. As shown the readout scheme 1700 can be accomplished with a counter (2K SubCnt) performing operations over two, instead of six or eight, cycles. In order to accomplish DDS, a total of four cycles may be required. For instance, referring to the "Read" data, the dark signal $R_{n-1}$ for row n−1 can be read during clock period 1722; then all sub-pixels $A_{n-1}$, $B_{n-1}$, $C_{n-1}$, $D_{n-1}$ can be transferred to floating diffusion $FD_{n-1}$ during clock period 1726 and the bright values $A_{n-1}$, $B_{n-1}$, $C_{n-1}$, $D_{n-1}$ can be read during clock period 1728. Again DDS can be applied by subtracting the dark values obtained during clock period 1722 from the bright values read during clock period 1728.

Figure 18A:
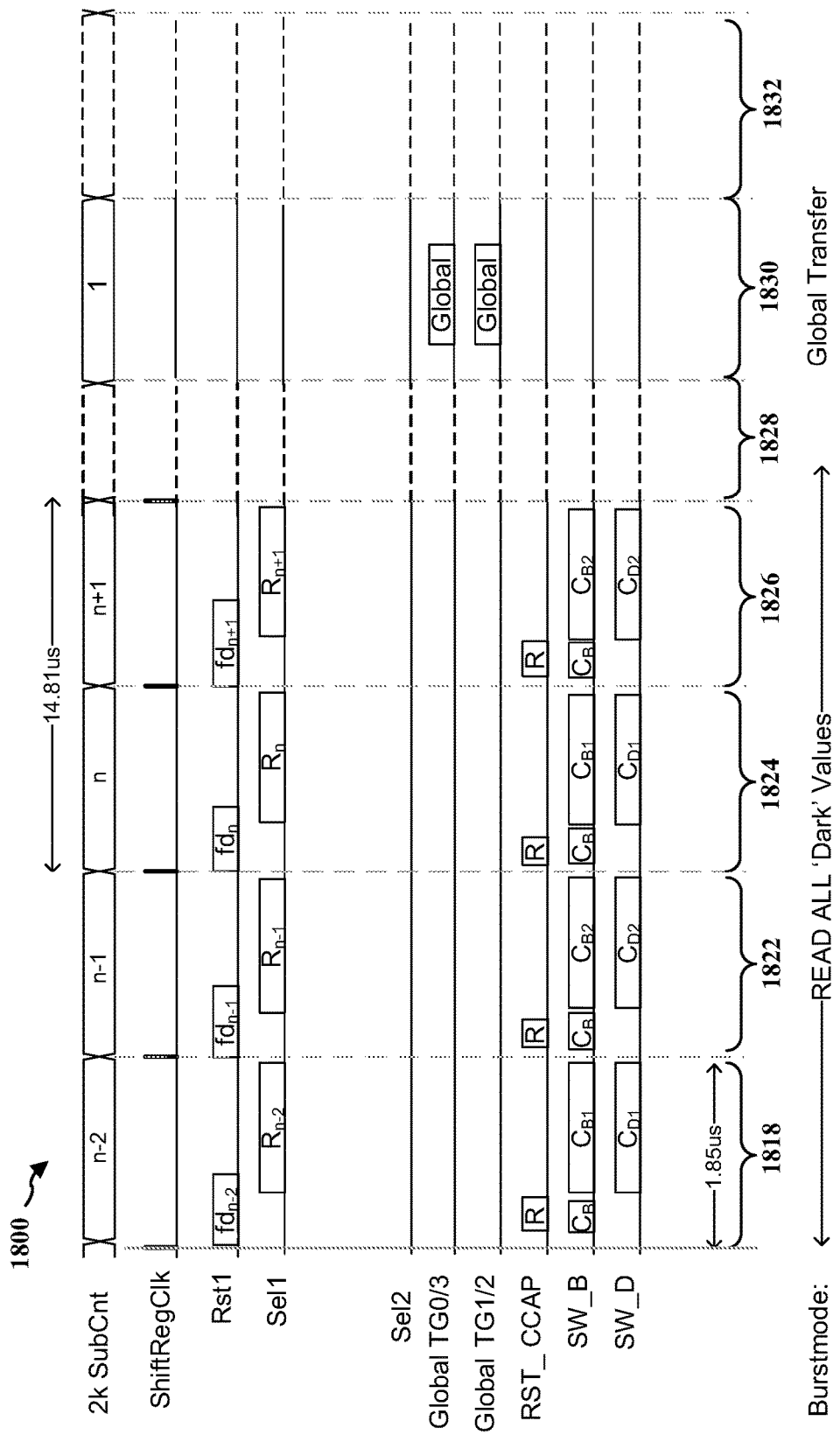
FIG. 18A illustrates a partial pixel timing readout scheme of signals corresponding to an HD mode using a global shutter sequence according to an embodiment.
Figure 18B:
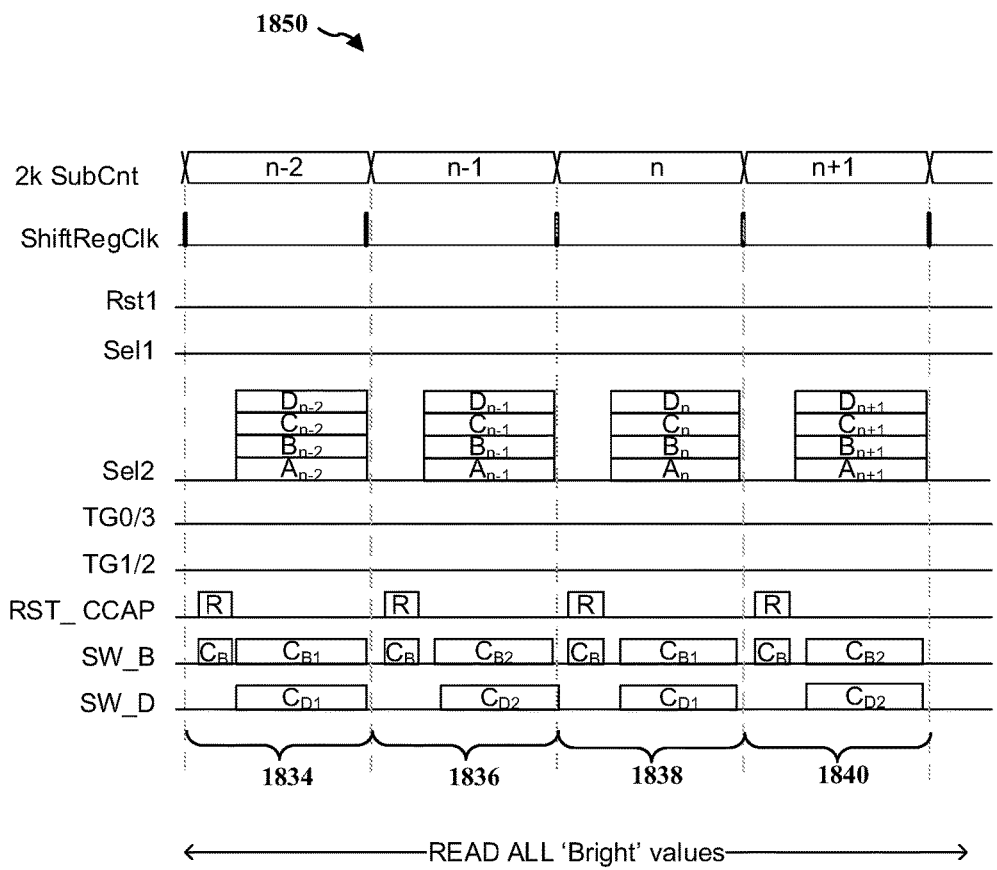
FIG. 18B illustrates a partial pixel timing readout scheme of signals corresponding to the embodiment of FIG. 18A.

FIG. 18A illustrates a partial pixel timing readout scheme 1800 of signals corresponding to an HD mode using a global shutter sequence according to an embodiment; and FIG. 18B illustrates a partial pixel timing readout scheme 1850 of signals corresponding to the embodiment of FIG. 18A.

Unlike the timing readout scheme 1700, the readout schemes 1800 and 1850 show timing for global shutter readout.

Again a counter with two cycles (2K SubCnt) is used to partition cycles 1818-1840; however, instead of sequentially reading rows of binned sub-pixels, all dark values are read, and then all bright values are read globally. For instance, during cycles 1818-1826 all dark values are read into memory. Then during cycles 1828-1832 all sub-pixels are binned to transfer charge from each sub-pixel photodiode to its respective, shared floating diffusion. Next, all bright values which were transferred to floating diffusions during cycles 1828-1832, are read during cycles 1834-1840.

Figure 19:
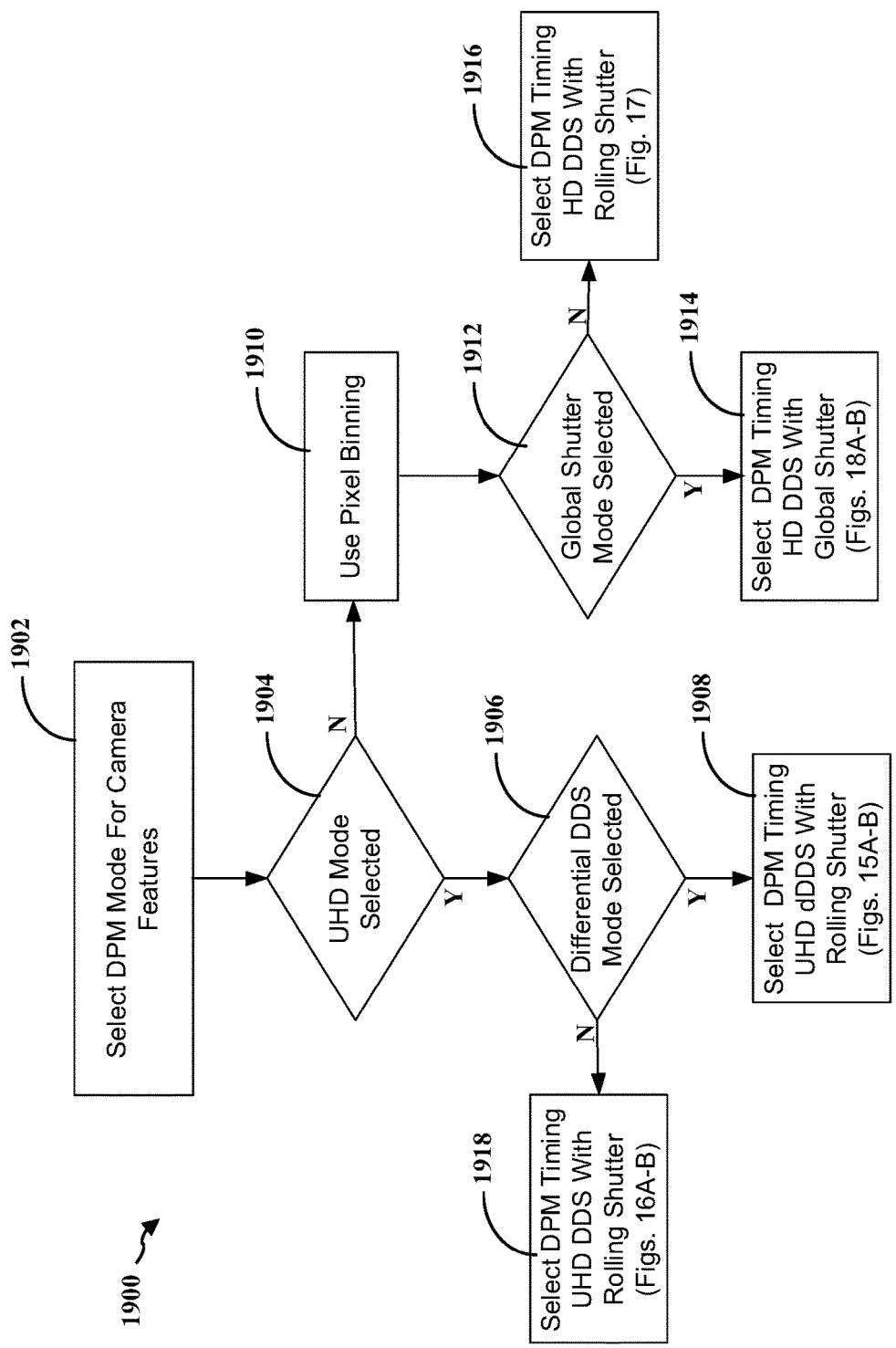
FIG. 19 illustrates a flowchart of dynamic pixel management according to an embodiment.

FIG. 19 illustrates a flowchart 1900 of dynamic pixel management according to an embodiment. The flowchart 1900 includes an initial operation step 1902, decision steps 1904, 1906, 1912, and mode operation steps 1908, 1910, 1914, 1916, 1918. The initial operation step 1902 can include reading the desired camera format from a camera user. This step can include receiving input from a menu or external control panel. Following the initial operation step 1902, a DPM module or another processing element within a camera can perform the decision step 1904.

Decision step 1904 determines if HD or UHD mode has been selected. If HD mode has been selected in decision step 1904, then DPM and/or a DPM module can control the CMOS image sensor to operate in HD mode with pixel binning, as indicated by the operation step 1910. Following step 1910 the decision step 1912 determines if global shutter or rolling shutter is to be used. If global shutter mode has been selected in decision step 1912, then DPM and/or the DPM module can control the CMOS image sensor to read pixels according to global shutter mode and pixel binning with DDS noise reduction. If rolling shutter mode has been selected in decision step 1912, then DPM and/or a DPM module can control the CMOS image sensor to read pixels according to rolling shutter mode and pixel binning with DDS noise reduction.

If UHD mode has been selected in decision step 1904, then the following decision step 1906 can determine if the CMOS image sensor is to be controlled for dDDS or DDS noise cancelation. If the decision step 1906 selects dDDS, then the DPM and/or the DPM module can control the CMOS image sensor to operate in UHD mode with dDDS noise cancelation and rolling shutter. If the decision step 1906 selects DDS, then the DPM and/or the DPM module can control the CMOS image sensor to operate in UHD mode with DDS noise cancelation and rolling shutter.

Although the DPM manages camera features described above include modes for HD, UHD, rolling shutter, and global shutter, other configurations are possible. Camera features can include, but are not limited to, depth of field, dynamic and static resolution, dynamic and static range, sensitivity and F-stop. For instance, the DPM can also be used to implement camera F-stop features with at least 15 F-stops.

As described above with respect to an exemplary embodiment, a 4T shared pixel CMOS image sensor is disclosed, for example as shown in FIG. 2, in which a shared pixel 200 includes four sub-pixels, e.g., photodiodes 210A, 210B, 210C and 210D (also shown as PD0-PD3) that are each driven by a respective transfer gate (shown as TG0-TG3). However, in this exemplary embodiment, these four photodiodes PD0-PD3 can also only be reset through their respective transfer gates TG0-TG3. As such, exposure control can be performed using the transfer gates TG0-TG3 in rolling shutter operation. Moreover, as further described above, this function can be performed in both binning and non-binning mode in a shared pixel design. Global shutter readout can also be performed in binning mode where the capacitor $C_{fd}$ is used as a storage node.

However, one limitation is that in binning mode, the transfer gates TG0-TG3 cannot be used for exposure control since the capacitor $C_{fd}$ would be affected when a new transfer is performed. More particularly, to readout a pixel of the exemplary pixel array of FIG. 2, the capacitor $C_{fd}$ first needs to be reset, which will lead to reset noise. To suppress this reset noise, the noise will typically be measured by reading the capacitor $C_{fd}$ reset noise directly after reset and storing the value. After global charge transfer of the photodiode to the capacitor $C_{fd}$, the reset noise and the image data is measured before the reset noise is subtracted from the combined measured value (i.e., image data plus reset noise) to determine the video data. Moreover, to reset the photodiodes as shown in the configuration of FIG. 2 (i.e., without global shutter), the only path is through the transfer gate and through the capacitor $C_{fd}$, which would inhibit global shutter mode together with the other constraints described herein. Accordingly, as will be described in detail below, adding a global shutter node for each pixel maintains the reset noise suppression functionality while also providing exposure time control, read while integrate and global shutter readout.

Thus, according to another exemplary embodiment of the present disclosure, a five transistor configuration is provided for global shutter readout in binning mode in which additional transistors (i.e., global shutter gates) are provided to provide exposure control of the pixel. Thus, according to this exemplary embodiment, a CMOS image sensor is disclosed that includes a 5T (i.e., five transistors)—4 shared pixel with reduced interconnection. In this aspect, the image sensor provides an exposure control in global shutter mode to an 4T—4 shared pixel design disclosed above, in which global shutter ("GS") gates of four sub pixels are connected together to reduce wiring. Advantageously, the exemplary embodiment provides for wiring the pixel in a larger technology node, for example, 110 nm can be used instead of 65 nm in an exemplary aspect.

Moreover, it is noted that while the exemplary embodiment described below is implemented in a 4 shared pixel configuration, different numbers of pair of sub-pixels can be provide in alternative embodiments. For example, in an alternative aspect, each pixel can be formed by two sub-pixels, although the configurations should in no way be limited to two pixels. In event, the exemplary embodiments is described below with respect to a 5T—four shared pixel configuration.

Figure 20A:
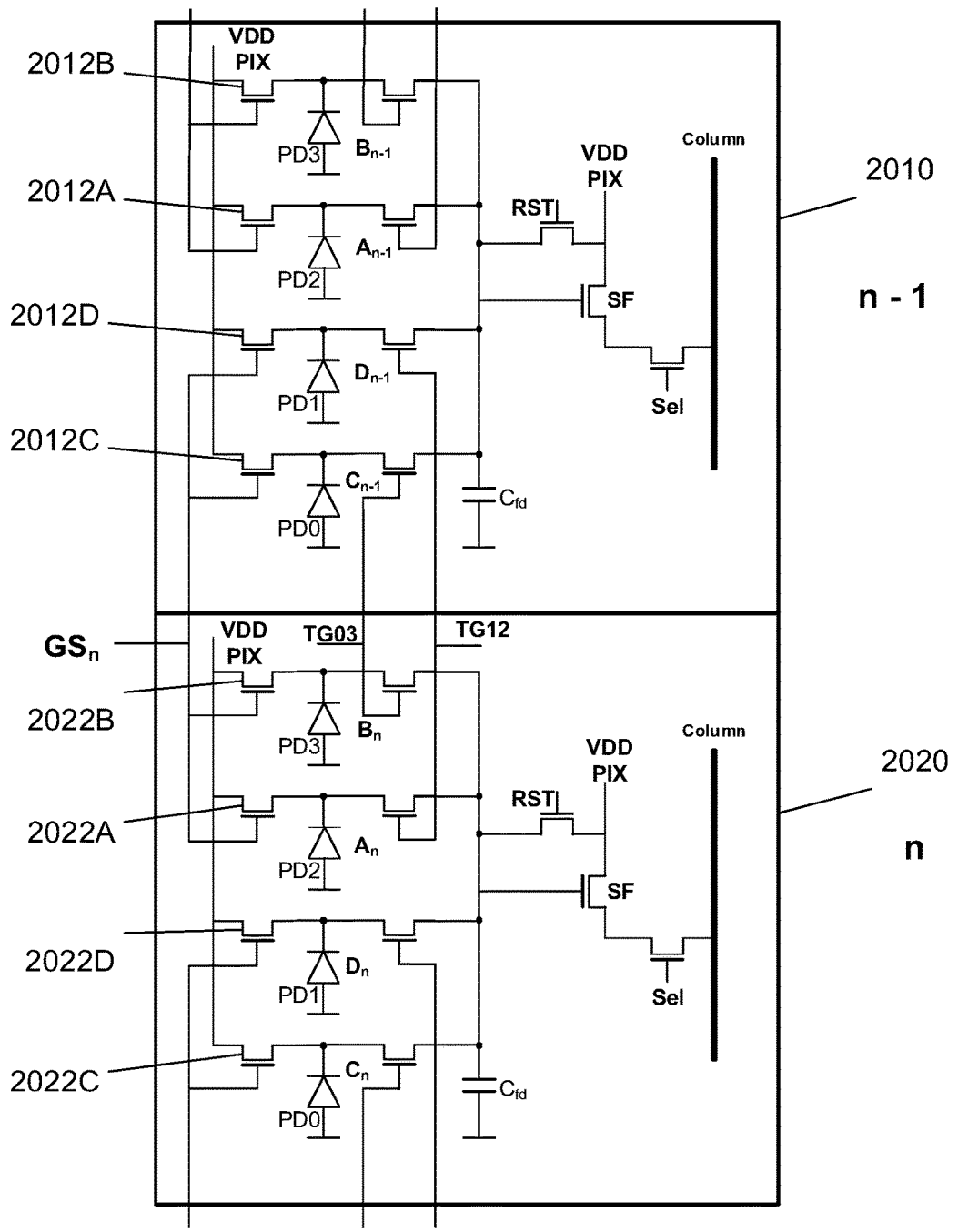
FIGS. 20A and 20B illustrate schematic diagrams of a plurality of 5T—4 shared pixels in a pixel array according to an exemplary embodiment.
Figure 20B:
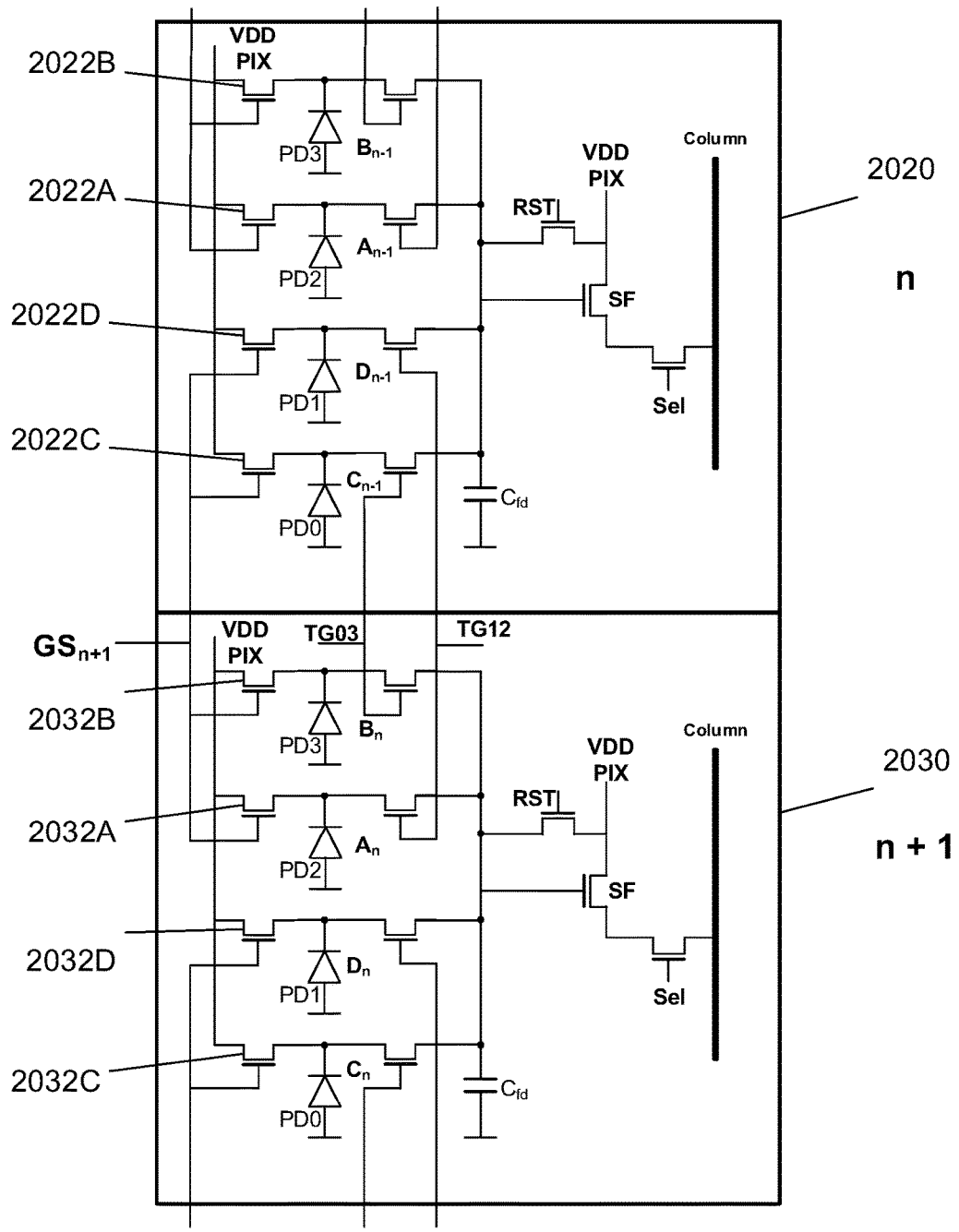

FIGS. 20A and 20B illustrate schematic diagrams of a plurality of 5T—4 shared pixels in a pixel array according to an exemplary embodiment. In general, it is noted that the exemplary pixel arrays shown in FIGS. 20A and 20B have a similar configuration to the 4T shared pixels in the pixel array disclosed, for example, as shown in FIG. 5. Thus, in this exemplary embodiment, each pixel includes four photodiodes with each pixel forming a row, such that a first pixel 2010 forms a first row (e.g., row n−1), a second pixel 2020 forms second row (e.g., row n), and a third pixel 2030 forms third row (e.g., row n+1). It should be appreciated that the pixel array contains any number of rows that extend in the vertical direction of the pixel array. Moreover, as further described above, the shared pixels shown in each of rows n−1 and n are wired such that one transfer gate signal TG 0/3 can be applied to the transfer gates of sub-pixel $C_{n-1}$ and sub-pixel $B_n$. Similarly, another transfer gate signal TG 1/2 can be applied to the transfer gates of sub-pixel $A_n$ and sub-pixel $D_{n-1}$. A similar wiring with transfer gate signals TG 0/3 and TG 1/2 can be applied to rows n and n+1 and so forth.

According to the exemplary embodiment, the 4T pixel described above is modified by including a fifth transistor or gate between each photodiode and the pixel voltage source (i.e., VDD PIX). For example, as shown in pixel 2010, a GS gate 2012C is provided between a first photodiode (i.e., sub-pixel $C_{n-1}$) and voltage source VDD, a GS gate 2012D is provided between a second photodiode (i.e., sub-pixel $D_{n-1}$) and voltage source VDD, a third GS gate 2012A is provided between a third photodiode (i.e., sub-pixel $A_{n-1}$) and voltage source VDD, and a GS gate 2012B is provided between a fourth photodiode (i.e., sub-pixel $B_{n-1}$) and voltage source VDD. Moreover, a similar configuration is provided for each other pixel (e.g., pixels 2020 and 2030) in the pixel array.

According to an exemplary aspect, the four GS gates 2012A-2012D of each pixel are transistors (e.g., MOSFETs) that are configured to collectively perform the global shutter function for the pixel array. In this regard, a first pair of GS gate transistors of the first pixel 2010 (e.g., GS gates 2012C and 2012D coupled to sub-pixel $C_{n-1}$ and sub-pixel $D_{n-1}$, respectively) are further connected to a second pair of GS gates of the second pixel 2020 (e.g., GS gates 2022B and 2022A coupled to sub-pixel $B_n$ and sub-pixel $A_n$, respectively). These four gates 2012C, 2012D, 2022B and 2022A can concurrently receive a GS signal n during readout to perform the global shutter function. Thus, in an exemplary aspect, the global shutter gates 2022B and 2022A of pixel n are connected to the global shutter gates 2012C and 2012D of pixel n−1 that is directly above pixel n relative to the vertical orientation of the pixel array.

As similarly shown in FIG. 20B, pixels 2020 and 2030 will be coupled in the same configuration. Thus, a first pair of GS gate transistors of the second pixel 2020 (e.g., GS gates 2022C and 2022D coupled to sub-pixel G and sub-pixel $D_n$, respectively) are further connected to a second pair of GS gates of the third pixel 2030 (e.g., GS gates 2032B and 2032A coupled to sub-pixel $B_{n+1}$ and sub-pixel $A_{n+1}$, respectively). Similarly, these four gates 2022C, 2022D, 2032B and 2032A can concurrently receive a GS signal n+1 during readout to perform the global shutter function. Thus, in an exemplary aspect, the global shutter gates 2022C and 2022D of pixel n are connected to the global shutter gates 2032A and 2012B of pixel n+1 that is directly below pixel n relative to the vertical orientation of the pixel array.

Figure 21A:
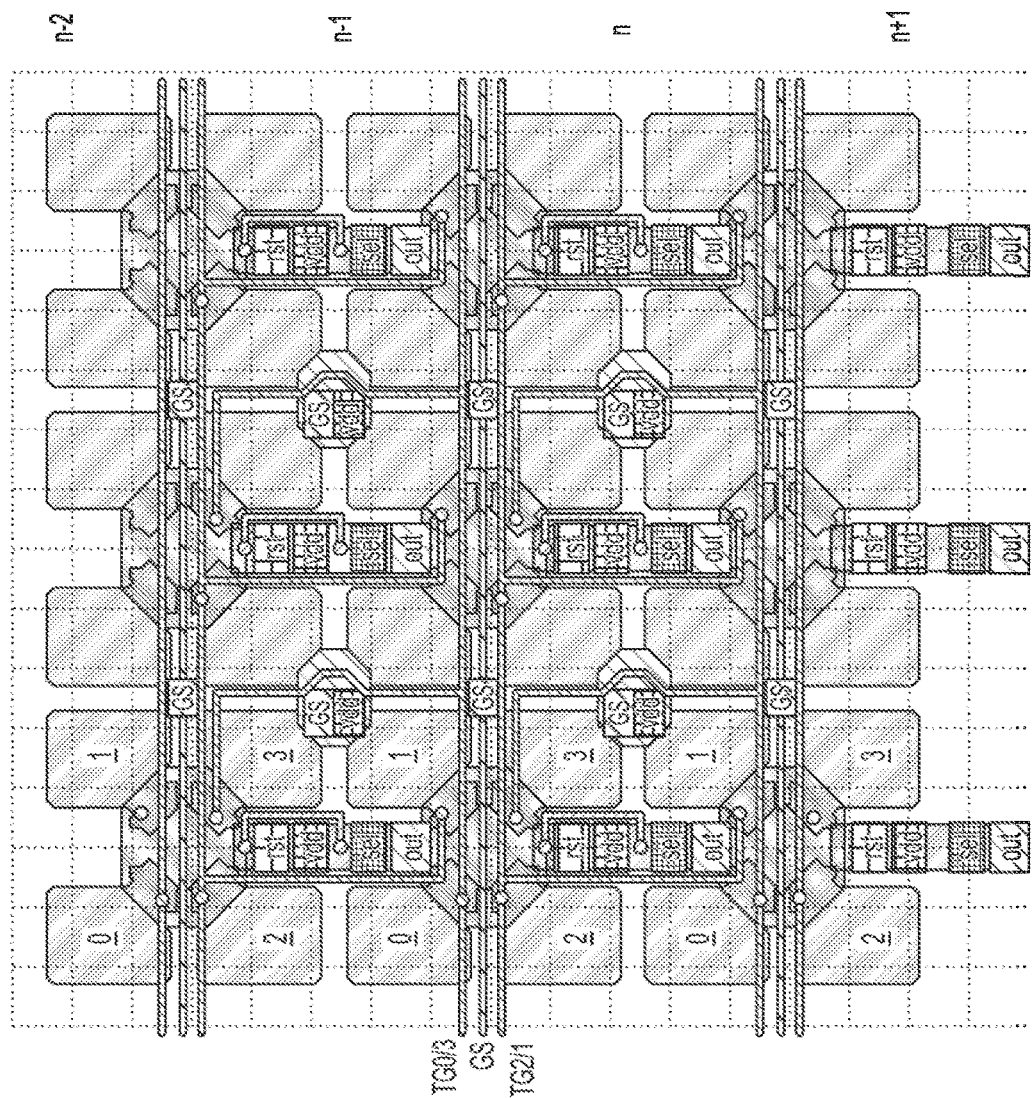
FIGS. 21A-21C illustrate exemplary metal connections and the global shutter gate location in each photodiode of the pixel array according to an exemplary aspect.
Figure 21B:
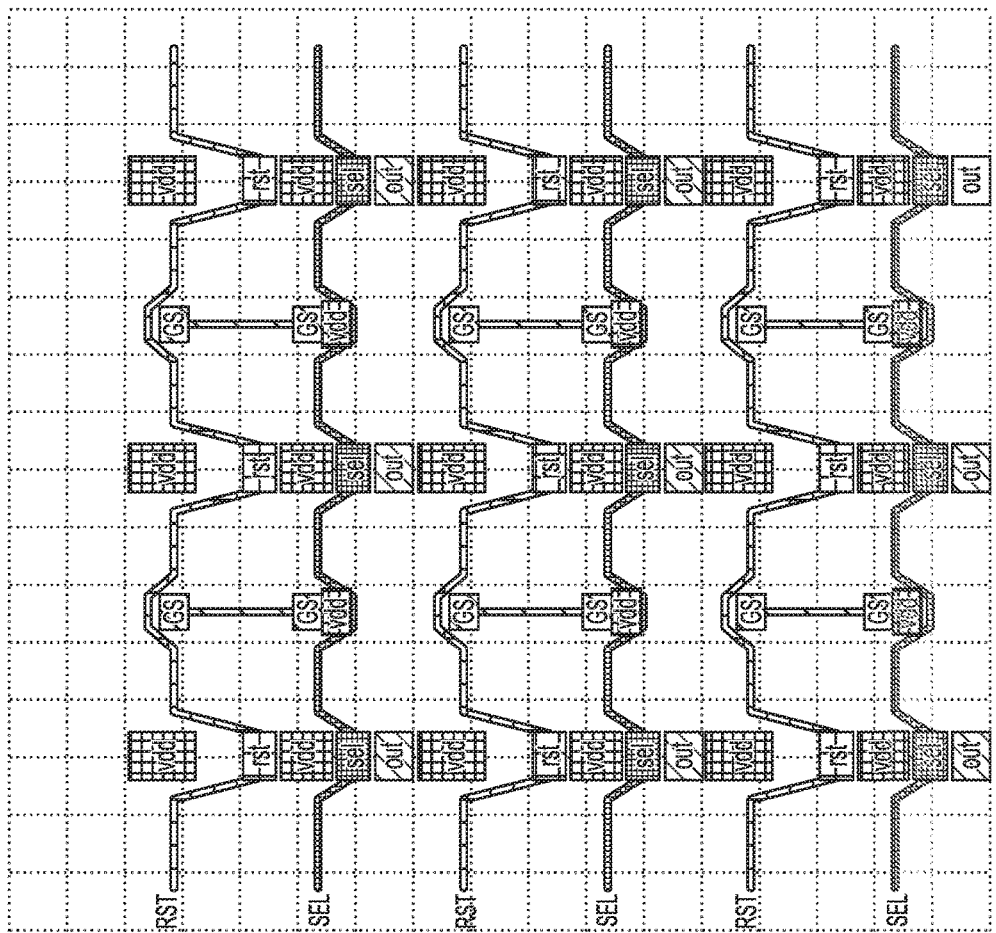
Figure 21C:
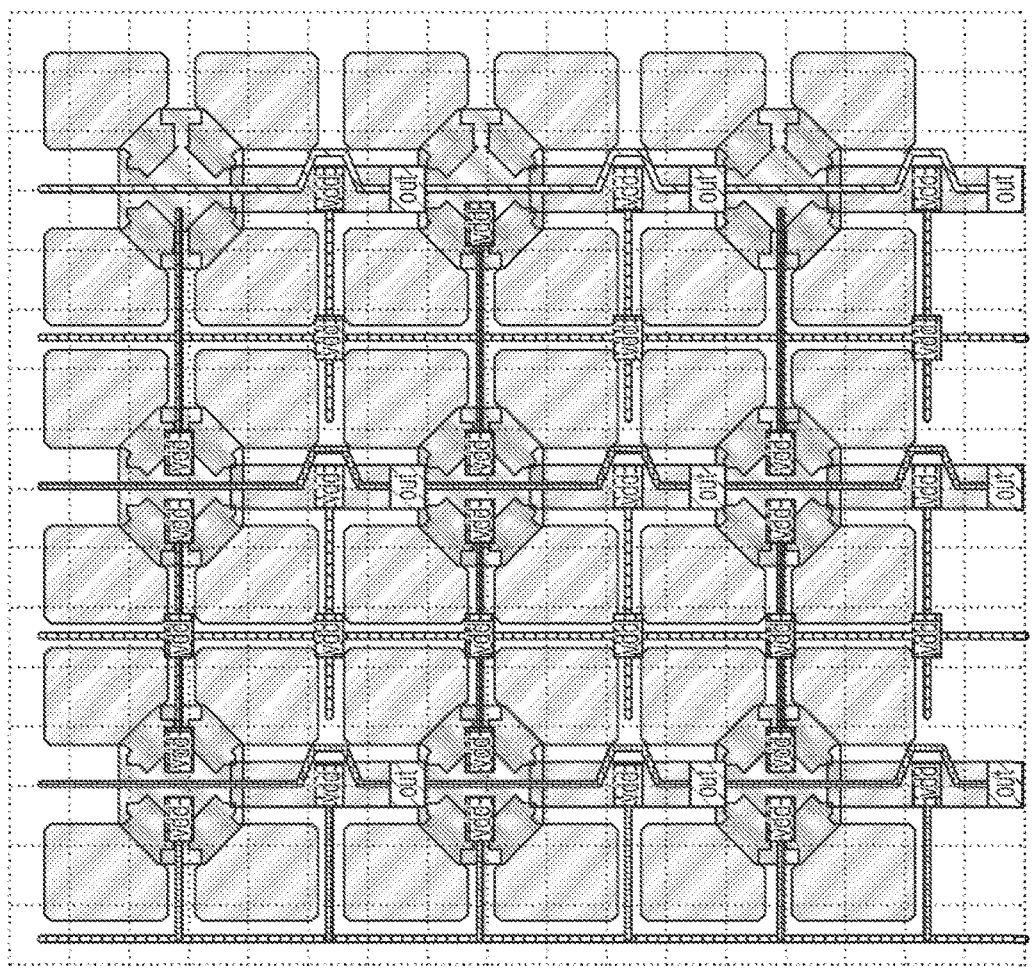

FIGS. 21A-21C illustrate exemplary metal connections and the global shutter gate location in each photodiode of the pixel array according to an exemplary aspect. For example, FIG. 21A illustrates metal layer 1, FIG. 21B illustrates metal layer 2, and FIG. 21C illustrates metal layer 3. Each of the metal layers as shown are top-down views of a portion of the pixel array according to an exemplary embodiment. Thus, each row includes a multitude of shared pixels as described above, with each shared pixel including four sub-pixels, i.e., photodiodes PD0-PD3. It is reiterated that the metals layers can have a similar configuration as shown above in FIG. 3 with respect to the 4T shared pixel design. However, as further shown in FIG. 21A, for example, each sub-pixel includes a GS gate coupled between the respective photodiode and the VDD PIX voltage supply.

Figure 22:
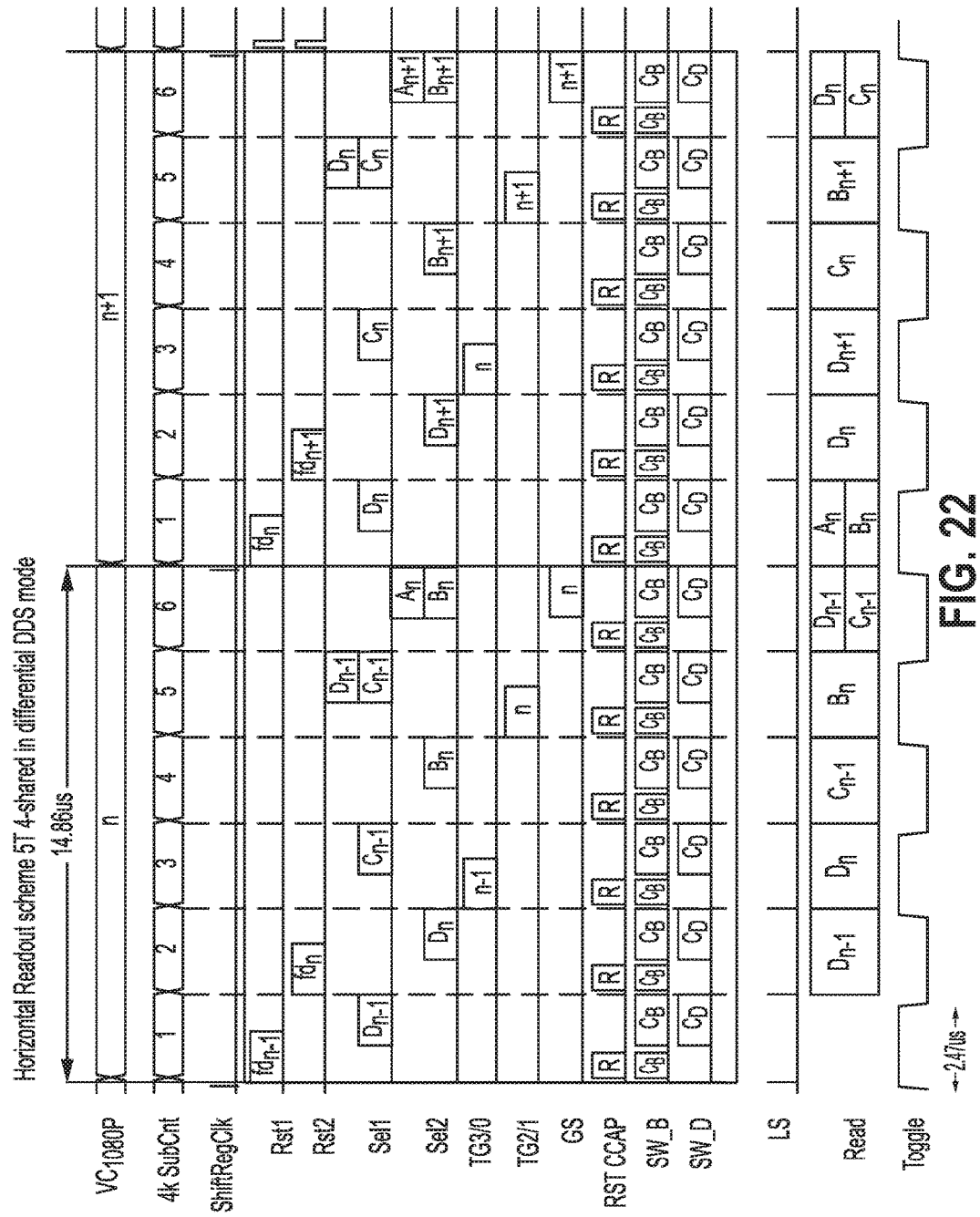
FIG. 22 illustrates a pixel timing readout scheme of signals from CMOS image sensor having the 5T—4 shared pixel configuration according to an exemplary embodiment.

FIG. 22 illustrates a pixel timing readout scheme of signals from CMOS image sensor having the 5T—4 shared pixel configuration according to an exemplary embodiment. It is noted that the exemplary pixel timing readout scheme comprises similar timing signals as shown above with respect to FIGS. 15A and 15B. Moreover, as further described above, the exemplary CMOS image sensor can be coupled to vertical and horizontal charge circuitry that is controlled by image capture timing controller (e.g., DPM control timing module 1004 and/or control unit 2650 as described herein). Thus, as further described above, the image capture timing controller can control the plurality of vertical and horizontal charge circuitry to bin charge concurrently between the four photodiodes and the shared floating diffusion node of each shared pixel unit in the pixel array to collectively sample output values of each shared pixel unit that combines output values of the four photodiodes during a respective readout cycle of the image capture.

As shown in FIG. 22, the exemplary readout scheme illustrates horizontal timing of a pixel array having a criss-cross interconnect pattern for providing differential digital double sampling. As shown, the horizontal readout scheme is based on a counter to provide cycles of six sub-counts as indicated by signal "4K SubCnt". In this regard, the counter performs the count operation in synchronization with clocks having a fixed period, for instance, a shift register clock signal "ShiftRegClk" is shown to provide a clock pulse every six cycles. Also, in regard to the counter based cycles, during each cycle a column capacitor is reset via the signal "RST_CCAP", as also described above. Moreover, in the exemplary aspect, the readout can performed in accordance with the 1080p standard with each readout (i.e., each clock cycle) being performed at 14.81 μs as indicated by the VC signal index. After each readout cycle, there can be six values that are obtained, two dark values, two bright values, and two double bright values. After the differential digital double sampling technique is applied using these values, corrected digital outputs of four pixels can be obtained, which generates an image according to the 4 k/UHD standard.

According to the exemplary aspect, the differential digital double sampling mode readout is provided for full readout. Advantageously, by providing the 5T—4 shared pixel configuration, the GS transistors/gates can used as, for example, anti-blooming gates, photodiode limiters and/or for rolling exposure time control (i.e., similar to a typical reset as in 4T operation, but easier to implement), for example. Thus, according to the exemplary aspect, the image capture timing controller is configured to apply a global shutter reset after each readout cycle of each respective shared pixel unit by applying a global shutter pulse to the respective global shutter gates of the respective shared unit pixel. In this aspect and as shown in FIG. 22, a GS signal (i.e., a GS reset pulse) is applied at the end of each cycle (i.e., at the end of each six sub-count). Thus, at the end of the nth cycle, a GS gate signal n is applied to the four gates 2012C, 2012D, 2022B and 2022A as described above. By applying this GS gate activation signal, the exemplary pixel array can effectively perform global shutter readout in binning mode without negatively affecting readout of values from capacitor $C_{fd}$. Moreover, as will be described in more detail below, the image capturing timing controller can further be configured to control an exposure time of each photodiode of each respective shared pixel by adjusting a width of the global shutter pulse to change the respective exposure time for the image capture.

Figure 23A:
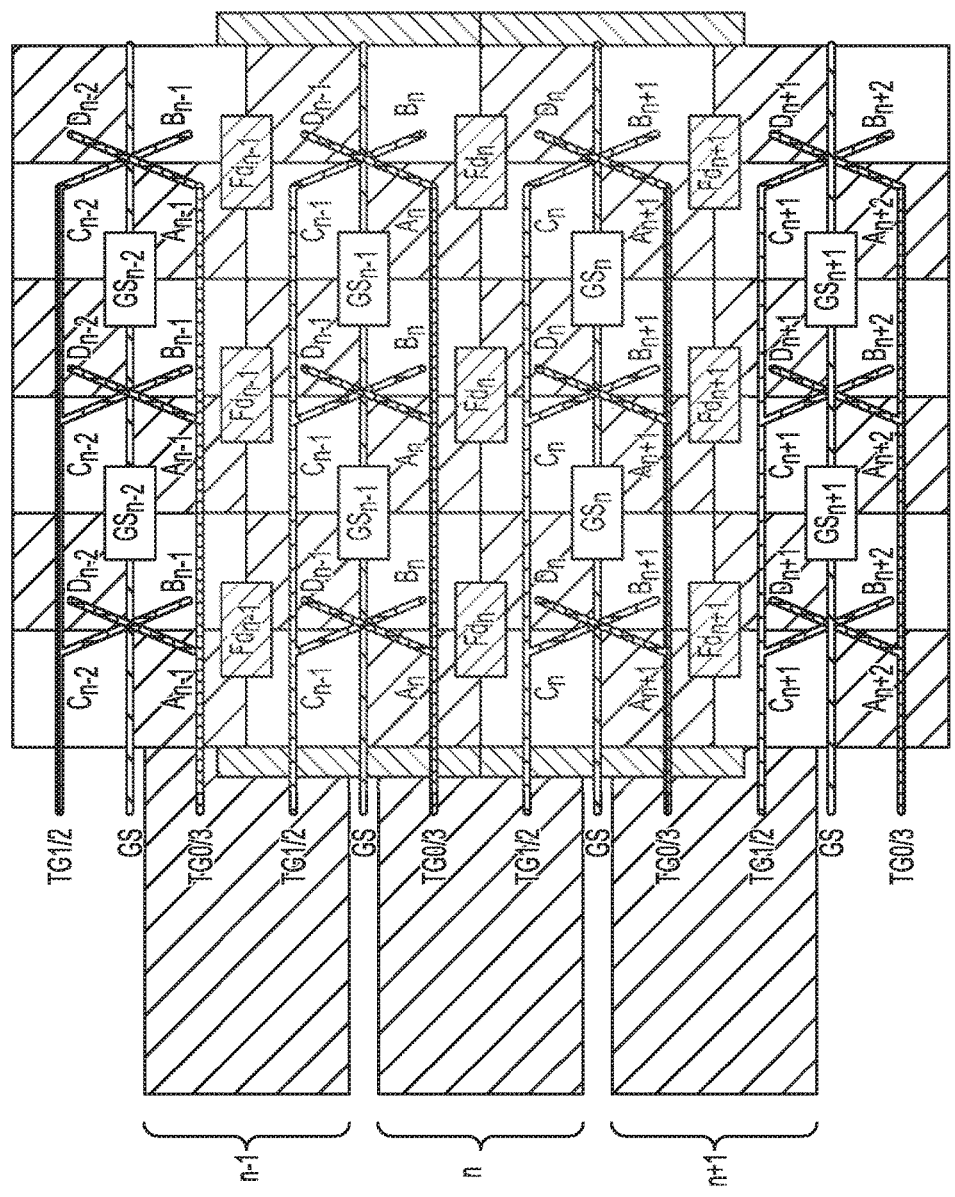
FIG. 23A illustrates a top-down view of a pixel array configured to perform differential digital double sampling according to an exemplary embodiment.
Figure 23B:
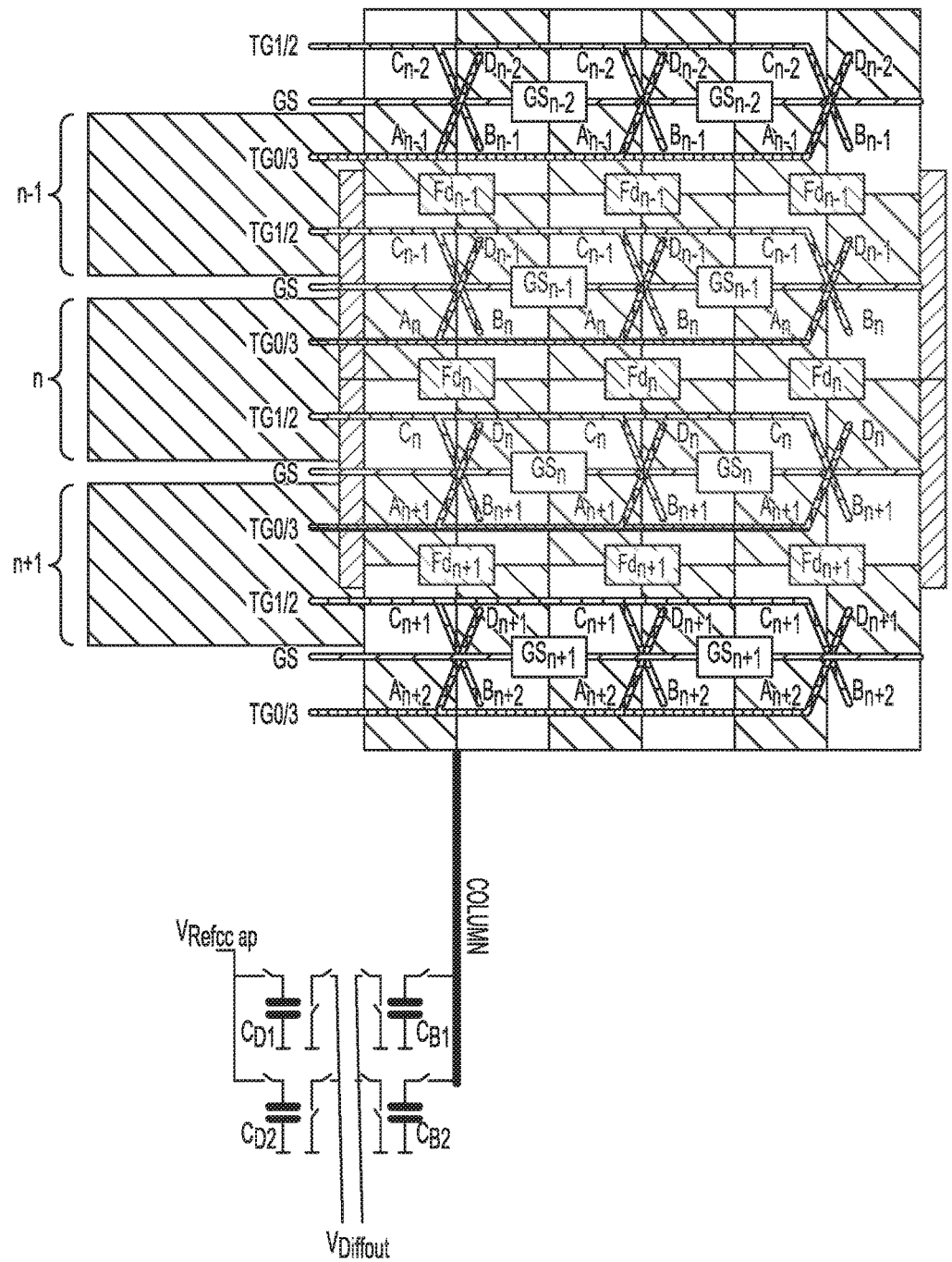
FIG. 23B illustrates a readout circuit of a CMOS image sensor for providing differential digital double sampling according to an exemplary embodiment.

FIG. 23A illustrates a top-down view of a pixel array configured to perform differential digital double sampling according to an exemplary embodiment. FIG. 23B illustrates a readout circuit of a CMOS image sensor for providing differential digital double sampling according to an exemplary embodiment.

It is noted that the pixel array and readout circuit are similar to the pixel array configuration shown in FIG. 4 and described above, for example. That is each shared pixel includes a floating diffusion point, which is illustrated as $FD_{n-1}$, $FD_n$, and $FD_{n+1}$. As described above, each transfer gate is activated for two adjacent sub-pixels in the vertical direction (relative to the array) that are in different adjacent pixel rows (e.g., in rows n−2 and n−1, n−1 and n, or in rows n and n+1). Thus, the transfer gates for sub-pixels $C_{n-1}$ and $B_n$ may first be activated by transfer gate signal 1/2. Since sub-pixels $C_{n-1}$ and $B_n$ are in different rows, i.e., different shared pixels, the values of the sub-pixels $C_{n-1}$ and $B_n$ may be read out during the same readout period. This process can be repeated for readout as also described above.

As described above, the exemplary pixel can be controlled to operate in a binning mode. Thus, for example, each pixel shown in FIG. 23A, in a HD mode, for example, is configured such that the sub-pixels (e.g., sub-pixels $A_{n-1}$, $B_{n-1}$, $C_{n-1}$ and $D_{n-1}$) can be transferred (binned) to their floating diffusion point (e.g., $FD_{n-1}$) concurrently for a combined sub-pixel readout along a column bit-line (column). The sub-pixels are binned in parallel to create a larger pixel having effectively four times the area of a sub-pixel. This can advantageously provide for a better pixel with more exposure surface area at the expense of lower overall pixel resolution. Thus, in pixel binning, four photo diodes are readout at once. Charge from four photo diodes is are binned (collected) at the floating diffusion node (e.g., $FD_{n-1}$), for example. This process is repeated for each pixel.

Moreover, as further shown and also described above with respect to FIG. 21A, a GS signal can be applied between two pairs of adjacent sub-pixels in each row. It should be appreciate that although the GS gates are shown as a single block (e.g., $GS_{n-1}$), each single GS block represents four separate GS gates as described above and that are coupled between each sub-pixel photodiode and the voltage source VDD PIX. In the exemplary aspect, each GS signal is applied to the set of GS gates (e.g., $GS_{n-2}$, $GS_{n-1}$, $GS_n$ and $GS_{n+1}$) during readout when the pixel array is selected in binning mode to perform the global shutter function.

Moreover, as shown in FIG. 23B, the circuit of the pixel array includes four capacitors provided to store the video level and the dark level for the digital double sampling. In particular, two "bright" capacitors are provided to sample the video level and two "dark" capacitors are provided to sample the reference level. Thus, as shown, two capacitors $C_{D1}$ and $C_{D2}$ are coupled to a capacitor reference voltage to readout a fixed value from the reference voltage while the other two capacitors $C_{B1}$ and $C_{B2}$ are coupled to the bitline of the pixel array to sample the pixel voltages of the dark, bright and double bright values of each pixel output (i.e., the video level). Preferably, the readout path is fully differential and the connection of each capacitor depends on the mode of operation as described above. Advantageously, using this design, the sampling of the pixel output voltage from the pixel array is decoupled from the A/D conversion. The decoupling enables high speed readout of the pixel output voltages by putting these two actions in parallel instead of serial operation. A more detailed description of the exemplary readout operation is described above with respect to FIG. 12, for example.

Figure 24:
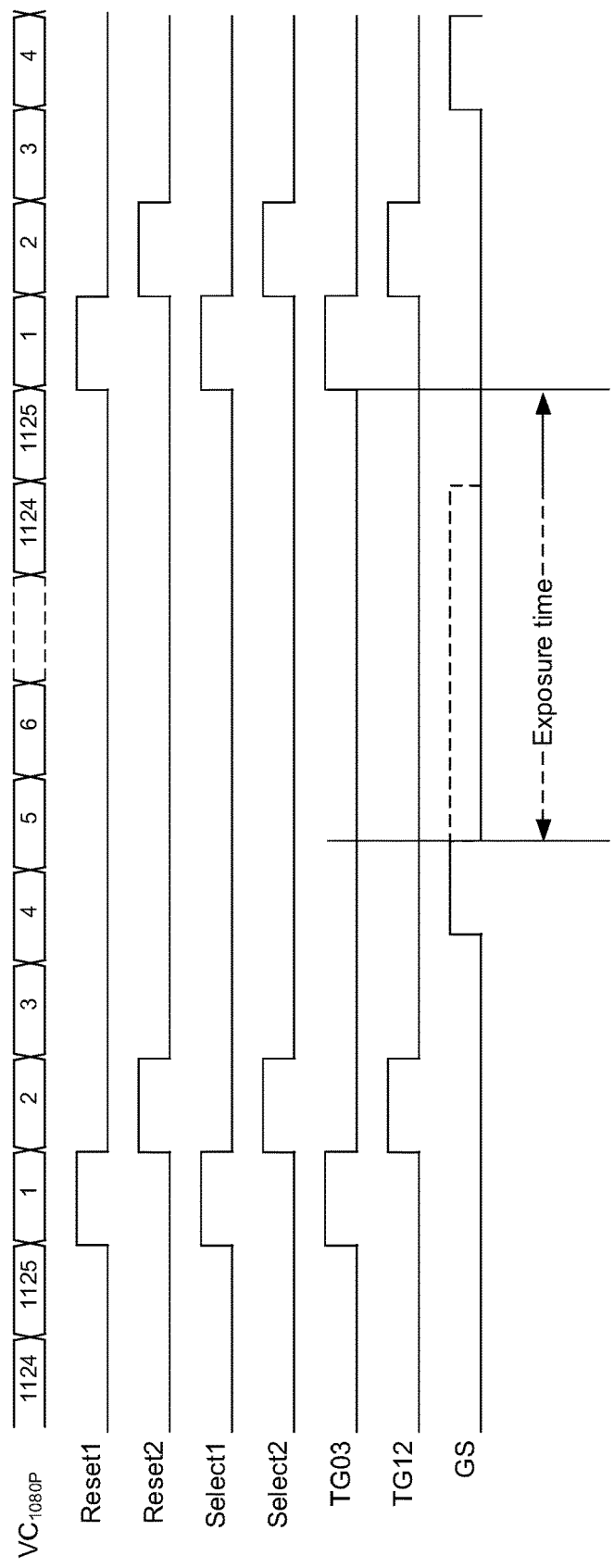
FIG. 24 illustrates a timing diagram of a vertical readout scheme for the 5T—4 shared pixel array according to an exemplary embodiment.

FIG. 24 illustrates a timing diagram of a vertical readout scheme for the 5T—4 shared pixel array according to an exemplary embodiment. In one exemplary aspect, the pixel array described herein preferably comprises vertical shift registers that are 1125 lines deep, i.e., 1125 rows in the array. Thus, the client VC1080p is shown as having counts 1 through 1125. Each of reset signals RST1 and RST, select signals SEL1 and SEL 2, transfer gate activation signals TG0/3 and TG1/2 and the global shutter GS signal are shown as cycling through in rows in response to control signals received from a row decoder as would be understood to one skilled in the art. Moreover, it should be appreciated that there are corresponding reset, select and transfer gate activation signals for each row in the pixel array. Thus, the rows are cycled through to be sampled as described using the timing operation described herein.

In addition to the non-binning mode (i.e., 4K mode) described above, the pixels of the disclosed pixel array can be read out in binning mode where full 5T functionality is present. In this aspect, the disclosed design adds global shutter exposure control functionality to the 4T—4 shared pixel (i.e., as shown in FIG. 1) by using the fifth transistor (e.g., 2012A-D, 2022-D, and 2032A-D) for global shutter.

Figure 25:
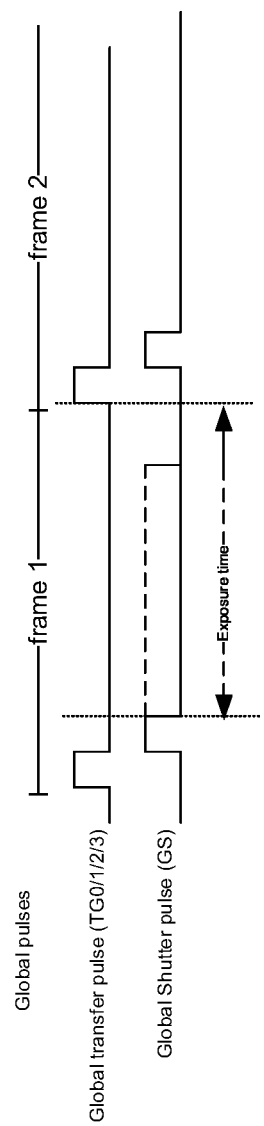
FIG. 25 illustrates a timing diagram of a vertical readout scheme of the global pulses when the 5T—4 shared pixel array is operating in the binning mode accordingly an exemplary embodiment.

FIG. 25 illustrates a timing diagram of a vertical readout scheme of the global pulses when the 5T—4 shared pixel array is operating in the binning mode accordingly an exemplary embodiment. Advantageously, the design in binning mode provides for global shutter readout with binning of the 4 subpixels (i.e., the four photodiodes PD0-PD3) of each pixel in the pixel array. The global shutter ("GS") can be used for exposure time control. That is, in an exemplary aspect, the exemplary 5T—4 shared pixel array can be implemented as CMOS image sensor pixel array 1008 described above with respect to FIG. 10. As further described above, the DPM module 1004 can provide signals to the vertical circuitry 1006 and to the horizontal circuitry 1010 so that sub-pixels of the 5T—4 shared pixel array (implemented as CMOS image sensor array 1008) are binned together and read in either a global shutter mode according to the pixel timing readout scheme of FIG. 22. Thus, in order to provide exposure time control of each pixel in the pixel array, the DPM module 1004 is configured to control and adjust the pulse width of the GS pulse signal as further shown in FIG. 25 (i.e., with the variation shown as a dashed line indicating the variation of pulse width and the resulting exposure time). It should be appreciated that exposure control (also referred to as shutter speed) is an important tool impacting how movement in a captured image/video appears. Exposure time is the length of time when the digital sensor inside the camera is exposed to light. Thus, be adjusting the pulse width of the GS reset pulse, the exemplary 5T—4 shared pixel array enables the image sensor to adjust the exposure time to effectively manipulate the visual effects of the final image. Moreover, in an exemplary aspect, the GS transistors can be configured as photodiode limiters with multilevel GSG high voltages for this pixel (i.e., same for non-binning mode).

Figure 26:
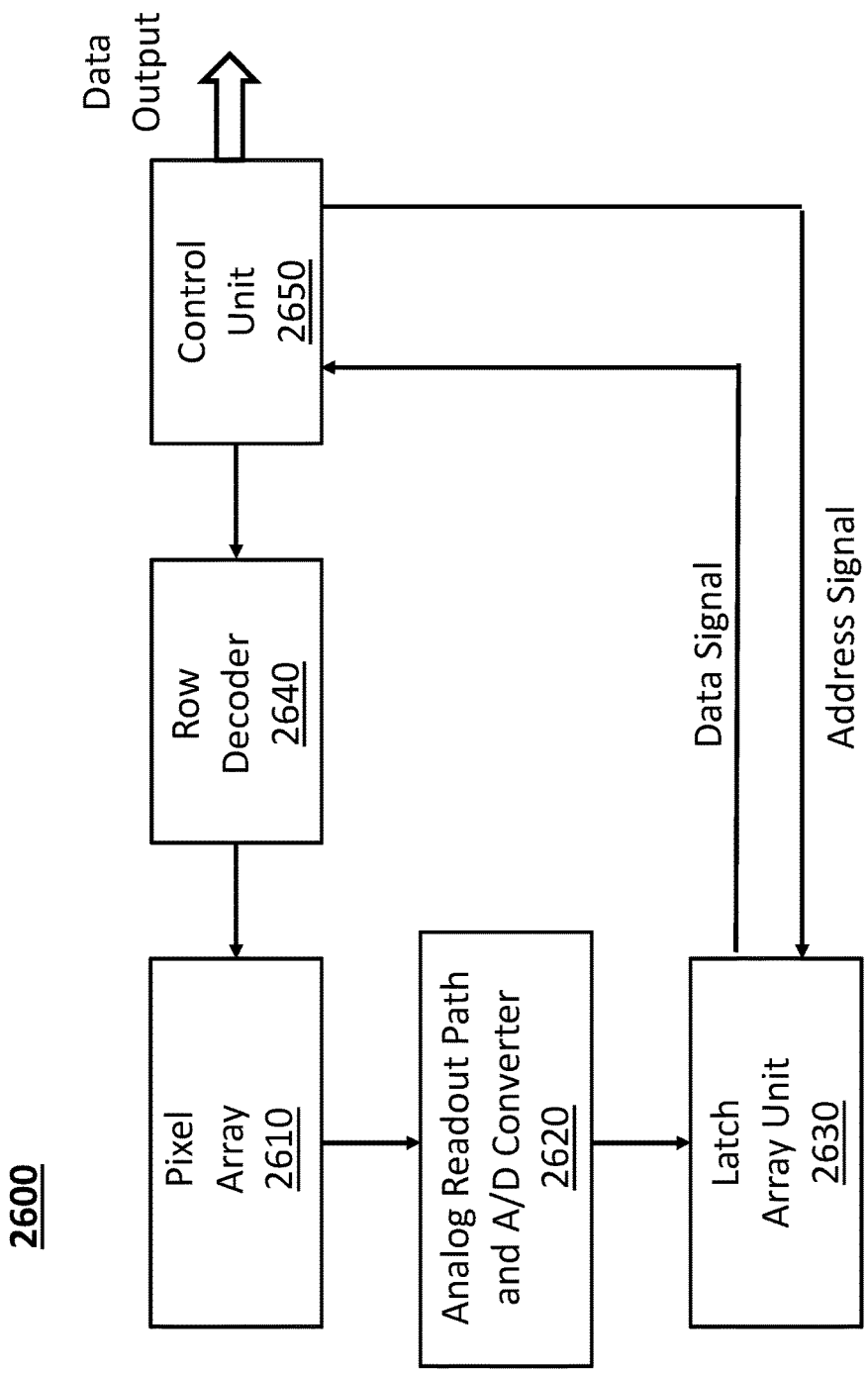
FIG. 26 illustrates a block diagram of a CMOS image sensor according to an exemplary embodiment.

Finally, FIG. 26 illustrates a block diagram of a CMOS image sensor according to an exemplary embodiment. It should be appreciated that the CMOS image sensor 2600 is another implementation of the system architecture of CMOS image sensor shown in FIG. 10 and described above. As shown, the CMOS image sensor 2600 includes a pixel array 2610, which can be, for example, the pixel array described herein that includes a multitude of 5T—4 share pixel configurations. Furthermore, the output of the pixel array 2610 is fed to an analog readout path and A/D converter 2620, which is provided for processing the analog output voltages from the pixel array 2610 to convert analog pixel signals into digital signals. The analog readout path and A/D converter 2620 can include the readout circuit shown in FIG. 23B and A/D converters for converting the measured analog signals to digital signals as is known to those skilled in the art.

As further shown, a latch array unit (or line buffer) 2630 is provided for storing the digital signals outputted from the analog readout path and A/D converter 2620. It should be appreciated that the line buffer 2630 can include multiple lines depending on the readout order of the pixels of pixel array 2610. Moreover, a control unit 2650 is provided for providing control signals used in controlling the aforementioned units and outputting data to the outside (e.g., a display unit) through an interface. For example, the control unit 2550 in conjunction with row decoder 940 can generate the activating signals described above with respect to FIG. 22, for example. Moreover, in one embodiment, the control unit 2650 can also generate the control signals to open and close the switches of the capacitor readout.

The control unit 2650 can includes one or more processors and one or more modules for executed the control algorithms described herein. The modules may be software modules running in the processor, or resident/stored in memory, one or more hardware modules coupled to the processor, or some combination thereof. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Furthermore, the control unit 2650 is coupled to a row decoder 2640 that is configured to output the signals for selecting the rows in the pixel array 2610 based on a control signal transmitted from the control unit 2650. According to an exemplary aspect, the exposure time can be set based on user instruction to the control unit 2650 and/or according automatic algorithm executed by control unit 2650 that sets the exposure time for a desired visual effect. The set exposure time it then translated in the correct driving pulses for the pixel array, which can be executed row by row using row decoder 2640 according to an exemplary aspect.

Moreover, in the exemplary aspect, the analog readout path and A/D converter 2620 includes comparators as many as the number of columns of the pixel array 2610 as described above. Each of the comparators serves a role of converting an analog pixel value of a column in which it is located into a digital signal. The digital signal is stored in the latch array unit 2630 including latches as many as the number of the columns of the pixel array 2610. The digital signals stored in the latch array unit 2630 are subjected to an image processing by the control unit 2650 and then, sequentially outputted through output pins of the image sensor in the image processed order.

According to the disclosure herein, the exemplary image sensor provides for an efficient readout of pixel values from a pixel array that reduces the required output bandwidth and enables digital double sampling through the whole analog chain of the pixel array. Moreover, using the disclosed technique, effects like Black sun and fluctuating analog disturbances are avoided and suppressed.

While aspects have been described in conjunction with the example implementations outlined above, various alternatives, modifications, variations, improvements, and/or substantial equivalents, whether known or that are or may be presently unforeseen, may become apparent to those having at least ordinary skill in the art. Accordingly, the example implementations of the invention, as set forth above, are intended to be illustrative, not limiting. Various changes may be made without departing from the spirit and scope of the aspects. Therefore, the aspects are intended to embrace all known or later-developed alternatives, modifications, variations, improvements, and/or substantial equivalents.

The previous description is provided to enable any person skilled in the art to fully understand the full scope of the disclosure. Modifications to the various exemplary embodiments disclosed herein will be readily apparent to those skilled in the art. Thus, the claims should not be limited to the various aspects of the disclosure described herein, but shall be accorded the full scope consistent with the language of claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in jurisdictions other than the United States, unless the element is expressly recited using the phrase "means for" or, in the case of a method claim, the element is recited using the phrase "step for."

What is claimed is:

1. An image sensing system for providing global shutter scanning with exposure time control during image capture, the image sensing system comprising:
    a complementary metal oxide semiconductor (CMOS) image sensor including a pixel array having a plurality of shared pixel units that each comprise four photodiodes with a floating diffusion node shared therebetween and a plurality of global shutter gates respectively disposed between each photodiode and a supply voltage of the CMOS image sensor;
    a plurality of vertical and horizontal charge circuitry coupled to the CMOS image sensor and configured to activate the plurality of shared pixel units during image capture;
    an image capture timing controller configured to control the plurality of vertical and horizontal charge circuitry to bin charge concurrently between the four photodiodes and the shared floating diffusion node of each shared pixel unit to collectively sample output values of each shared pixel unit that combines output values of the four photodiodes during a respective readout cycle of the image capture;
    a column readout circuit having a plurality of storage capacitors selectively coupled to the pixel array that are each configured to store sampled output values of the four photodiodes of each shared pixel unit during each respective readout cycle by the CMOS image sensor; and
    an image generating unit configured to generate image data based on the stored sampled output values in the plurality of storage capacitors with the generated image data being configured to be displayed on a display device, wherein each shared pixel unit comprises four global shutter gates with a first pair of global shutter gates connected to a pair of adjacent global shutter gates in a first adjacent shared pixel unit and a second pair of global shutter gates connected to a pair of adjacent global shutter gates in a second adjacent shared pixel unit, wherein the image capture timing controller is configured to apply a global shutter reset after each readout cycle of each respective shared pixel unit by applying a global shutter pulse to the respective global shutter gates of the respective shared unit pixel without affecting the sampled output values of the floating diffusion node during the respective readout cycle, and wherein the image capture timing controller is configured to control an exposure time of each photodiode of each respective shared pixel by adjusting a width of the global shutter pulse to change the respective exposure time for the image capture.

2. The image sensing system according to claim 1, wherein the first pair of global shutter gates of each shared pixel unit are connected to a pair of adjacent global shutter gates in the first adjacent shared pixel unit that is directly above the respective shared pixel unit of the pixel array, and wherein the second pair of global shutter gates of each shared pixel unit are connected to a pair of adjacent global shutter gates in the second adjacent shared pixel unit that is directly below the respective shared pixel unit of the pixel array.

3. The image sensing system according to claim 1, wherein each of the plurality of global shutter gates is a MOSFET.

4. The image sensing system according to claim 1, wherein the pixel array comprises a first row of shared pixel units comprising at least one first shared pixel unit and a second row of shared pixel units comprising at least one second shared pixel unit.

5. The image sensing system according to claim 4, wherein the column readout circuit is further configured to read the stored sampled output values from the shared floating diffusion node of the at least one first shared pixel unit and the shared floating diffusion node of the at least one second shared pixel unit.

6. An image sensing system for providing global shutter scanning with exposure time control, the image sensing system comprising:

an image sensor including a pixel array having a plurality of shared pixel units that each comprise a plurality of photodiodes with a floating diffusion node shared therebetween and a plurality of global shutter gates respectively disposed between each photodiode and a supply voltage of the image sensor;

an image capture timing controller configured to control the image sensor to bin charge concurrently between the plurality of photodiodes and the shared floating diffusion node of each shared pixel unit to collectively sample output values of each shared pixel unit that combines output values of the plurality of photodiodes during a respective readout cycle of the image capture;

an image generator configured to generate image data based on the sampled output values, with the generated image data being configured to be displayed on a display device, wherein, for each shared pixel unit, a first pair of global shutter gates are connected to a pair of global shutter gates in a first adjacent shared pixel unit and a second pair of global shutter gates connected to a pair of global shutter gates in a second adjacent shared pixel unit, wherein the image capture timing controller is configured to apply a global shutter reset pulse after each readout cycle of each respective shared pixel unit without affecting the sampled output values of the floating diffusion node during the respective readout cycle, and wherein the image capture timing controller is configured to control an exposure time of each photodiode of each respective shared pixel by adjusting a width of the global shutter reset pulse to change the respective exposure time for the image capture.

7. The image sensing system according to claim 6, further comprising a plurality of vertical and horizontal charge circuitry coupled to the image sensor and configured to activate the plurality of shared pixel units during image capture.

8. The image sensing system according to claim 7, wherein the image capture timing controller is configured to control the plurality of vertical and horizontal charge circuitry to bin charge concurrently between the plurality of photodiodes and the shared floating diffusion node of each shared pixel unit to collectively sample output values of each shared pixel unit that combines output values of the plurality of photodiodes during the respective readout cycle of the image capture.

9. The image sensing system according to claim 6, wherein the first pair of global shutter gates of each shared pixel unit are connected to the pair of global shutter gates in the first adjacent shared pixel unit that is directly above the respective shared pixel unit of the pixel array, and wherein the second pair of global shutter gates of each shared pixel unit are connected to the pair of global shutter gates in the second adjacent shared pixel unit that is directly below the respective shared pixel unit of the pixel array.

10. The image sensing system according to claim 6, wherein each of the plurality of global shutter gates is a MOSFET.

11. The image sensing system according to claim 6, wherein the pixel array comprises a first row of shared pixel units comprising at least one first shared pixel unit and a second row of shared pixel units comprising at least one second shared pixel unit.

12. The image sensing system according to claim 11, further comprising a column readout circuit having a plurality of storage capacitors selectively coupled to the pixel array that are each configured to store sampled output values of the plurality of photodiodes of each shared pixel unit during each respective readout cycle of the image capture by the image sensor.

13. The image sensing system according to claim 12, wherein the column readout circuit is further configured to read the stored sampled output values from the shared floating diffusion node of the at least one first shared pixel unit and the shared floating diffusion node of the at least one second shared pixel unit.

14. An image sensor for providing global shutter scanning with exposure time control during image capture, the image sensor comprising:

a pixel array having a plurality of shared pixel units that each comprise a plurality of photodiodes with a floating diffusion node shared therebetween and a plurality of global shutter gates respectively disposed between each photodiode and a supply voltage of the pixel array; and an image capture timing controller configured to control an exposure time of each photodiode by adjusting a width of a global shutter reset pulse applied to the plurality of global shutter gates after each readout cycle during image capture to change the respective exposure time of each shared pixel unit.

15. The image sensor according to claim 14, wherein the image capture timing controller is further configured to control the pixel array to output values of each shared pixel unit during respective readout cycles of the image capture.

16. The image sensor according to claim 15, wherein the image capture timing controller is further configured to control the pixel array to bin charge concurrently between the plurality of photodiodes and the shared floating diffusion node of each shared pixel unit to collectively sample output values of each shared pixel unit that combines output values of the plurality of photodiodes during a respective readout cycle of the image capture.

17. The image sensor according to claim 16, wherein the image capture timing controller applies the global shutter reset pulse after each readout cycle of each respective shared pixel unit without affecting the sampled output values of the respective floating diffusion node during the respective readout cycle.

18. The image sensor according to claim 16, further comprising a plurality of vertical and horizontal charge circuitry coupled to the pixel array and configured to activate the plurality of shared pixel units during image capture.

19. The image sensor according to claim 18, wherein the image capture timing controller is configured to control the plurality of vertical and horizontal charge circuitry to bin charge concurrently between the plurality of photodiodes and the shared floating diffusion node of each shared pixel unit to collectively sample output values of each shared pixel unit that combines output values of the plurality of photodiodes during a respective readout cycle of the image capture.

20. The image sensor according to claim 14, wherein, for each shared pixel unit, a first pair of global shutter gates are connected to a pair of global shutter gates in a first adjacent shared pixel unit and a second pair of global shutter gates connected to a pair of global shutter gates in a second adjacent shared pixel unit.

21. The image sensor according to claim 20, wherein the first pair of global shutter gates of each shared pixel unit are connected to the pair of global shutter gates in the first adjacent shared pixel unit that is directly above the respective shared pixel unit of the pixel array, and wherein the second pair of global shutter gates of each shared pixel unit are connected to the pair of global shutter gates in the second adjacent shared pixel unit that is directly below the respective shared pixel unit of the pixel array.

22. The image sensor according to claim 19, further comprising an image generator configured to generate image data based on the sampled output values, with the generated image data being configured to be displayed on a display device.

23. The image sensor according to claim 14, wherein each of the plurality of global shutter gates is a MOSFET.

24. The image sensor according to claim 14, wherein the pixel array comprises a first row of shared pixel units comprising at least one first shared pixel unit and a second row of shared pixel units comprising at least one second shared pixel unit.

25. The image sensor according to claim 24, further comprising a column readout circuit having a plurality of storage capacitors selectively coupled to the pixel array that are each configured to store sampled output values of the plurality of photodiodes of each shared pixel unit during each respective readout cycle of the image capture.

26. The image sensor according to claim 25, wherein the column readout circuit is further configured to read the stored sampled output values from the shared floating diffusion node of the at least one first shared pixel unit and the shared floating diffusion node of the at least one second shared pixel unit.

27. The image sensor according to claim 14, wherein each shared pixel unit of the pixel array comprises two photodiodes.

28. The image sensor according to claim 14, wherein each shared pixel unit of the pixel array comprises four photodiodes.

* * * * *